United States Patent
Lee et al.

(10) Patent No.: US 9,692,013 B2
(45) Date of Patent: Jun. 27, 2017

(54) ORGANIC LIGHT EMITTING DEVICE

(71) Applicant: LG Display Co., Ltd., Seoul (KR)

(72) Inventors: Se Hee Lee, Gyeonggi-do (KR); Joo Hwan Hwang, Daegu (KR); Sang Kyoung Moon, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/554,314

(22) Filed: Nov. 26, 2014

(65) Prior Publication Data

US 2015/0144926 A1    May 28, 2015

(30) Foreign Application Priority Data

Nov. 26, 2013 (KR) .......................... 10-2013-0144759

(51) Int. Cl.
*H01L 29/08* (2006.01)
*H01L 51/52* (2006.01)
(Continued)

(52) U.S. Cl.
CPC ...... *H01L 51/5265* (2013.01); *H01L 51/5044* (2013.01); *H01L 51/5278* (2013.01);
(Continued)

(58) Field of Classification Search
CPC ............. H01L 51/5265; H01L 51/5036; H01L 51/5278; H01L 51/504; H01L 27/3211; H01L 27/3209; H01L 27/302
See application file for complete search history.

(56) References Cited

U.S. PATENT DOCUMENTS 7,098,590 B2 *  8/2006  Lim .................... H01L 51/5265
                                                     313/504
7,812,529 B2 * 10/2010  Choi ................... H01L 51/5036
                                                     313/498
(Continued)

FOREIGN PATENT DOCUMENTS

CN          102034850 A        4/2011
CN          102201431 A        9/2011

OTHER PUBLICATIONS

Cheng et al.—Role of the Charge Generation Layer in Tandem Organic Light-Emitting Diodes Investigated by Time-Resolved Electroluminescence Spectroscopy, 2011, J. Phys. Chem. C 2011, 115, 582-588.*

(Continued)

*Primary Examiner* — Reema Patel
*Assistant Examiner* — Syed Gheyas
(74) *Attorney, Agent, or Firm* — Morgan, Lewis & Bockius LLP

(57) ABSTRACT

Disclosed is an organic light emitting device. The organic light emitting device includes a first emission unit configured to include a common blue emission material layer which is included in common in a plurality of pixels emitting lights having different wavelength ranges, a second emission unit configured to include a red emission material layer, a green emission material layer, and a blue emission material layer which respectively emit lights having different wavelength ranges, a charge generation layer disposed between the first emission unit and the second emission unit, a first electrode formed as a reflective electrode, and configured to supply an electric charge having a first polarity to the first emission unit and the second emission unit, and a second electrode formed as a semi-transmissive electrode, and con- (Continued)

figured to supply an electric charge having a second polarity to the first emission unit and the second emission unit.

19 Claims, 12 Drawing Sheets

(51) Int. Cl.
*H01L 51/50* (2006.01)
*H01L 27/32* (2006.01)

(52) U.S. Cl.
CPC ....... *H01L 27/3211* (2013.01); *H01L 51/5056* (2013.01); *H01L 51/5072* (2013.01)

(56) References Cited

U.S. PATENT DOCUMENTS

| | | | |
|---|---|---|---|
| 7,994,498 B2* | 8/2011 | Pieh | H01L 27/3209 257/40 |
| 8,338,222 B2* | 12/2012 | Kim | H01L 27/3211 257/40 |
| 2005/0162075 A1* | 7/2005 | Madathil | H01L 51/5088 313/504 |
| 2008/0286610 A1* | 11/2008 | Deaton | H01L 51/5016 428/704 |
| 2010/0090241 A1* | 4/2010 | D'Andrade | H01L 27/3211 257/98 |
| 2011/0073885 A1 | 3/2011 | Kim et al. | |
| 2011/0121342 A1* | 5/2011 | Jun | H01L 51/504 257/98 |
| 2011/0233576 A1 | 9/2011 | Okutani et al. | |
| 2013/0001526 A1* | 1/2013 | Kwak | H01L 51/5265 257/40 |
| 2014/0065750 A1* | 3/2014 | Harikrishna Mohan | H01L 51/5265 438/35 |
| 2014/0326957 A1* | 11/2014 | Lee | H01L 51/504 257/40 |
| 2015/0137082 A1* | 5/2015 | Kim | H01L 51/5203 257/40 |

OTHER PUBLICATIONS

The First Office Action dated Jun. 1, 2016 from the State Intellectual Property Office of the People's Republic of China in counterpart Chinese application No. 201410692490.6.

* cited by examiner

FIG. 2

|  | blue (nm) | green (nm) | red (nm) |
|---|---|---|---|
| ETL | 35 | 35 | 35 |
| EML | 20 | 40 | 36 |
| HTL | 123.4 | 143.5 | 193 |
| HIL | 10 | 10 | 10 |
| Total Thickness | 188.4 | 228.5 | 274 |

FIG. 4

|  | blue (nm) | green (nm) | red (nm) |
|---|---|---|---|
| ETL 2 | 35 | 35 | 35 |
| EML 2 | 7 | 53 | 115.6 |
| HTL 2 | 42 | 42 | 42 |
| CGL | 10 | 10 | 10 |
| ETL 1 | 35 | 35 | 35 |
| EML 1 | 19 | 19 | 19 |
| HTL 1 | 30 | 30 | 30 |
| HIL | 10 | 10 | 10 |
| Total Thickness | 188 | 234 | 296.6 |

FIG. 5

| color | | Comparative Example | First Embodiment | Second Embodiment | Third Embodiment | Fourth Embodiment |
|---|---|---|---|---|---|---|
| blue | Curr. Eff. [Cd/A] | 3.3 | 4.43 | 4.43 | 4.43 | 4.43 |
| | CIE_x | 0.138 | 0.137 | 0.137 | 0.137 | 0.137 |
| | CIE_y | 0.050 | 0.049 | 0.049 | 0.049 | 0.049 |
| green | Curr. Eff. [Cd/A] | 33 | 32.95 | 33.8 | 32.95 | 33.8 |
| | CIE_x | 0.211 | 0.214 | 0.215 | 0.214 | 0.215 |
| | CIE_y | 0.675 | 0.68 | 0.678 | 0.68 | 0.678 |
| red | Curr. Eff. [Cd/A] | 13.6 | 11.2 | 11.2 | 15.3 | 15.3 |
| | CIE_x | 0.651 | 0.653 | 0.653 | 0.645 | 0.645 |
| | CIE_y | 0.347 | 0.308 | 0.308 | 0.326 | 0.326 |

FIG. 6

| color | | Comparative Example | First Embodiment | Second Embodiment | Third Embodiment | Fourth Embodiment |
|---|---|---|---|---|---|---|
| blue | Curr. Eff. [Cd/A] | 3.5 | 4.8 | 4.8 | 4.8 | 4.8 |
| | CIE_x | 0.138 | 0.138 | 0.138 | 0.138 | 0.138 |
| | CIE_y | 0.050 | 0.050 | 0.050 | 0.050 | 0.050 |
| green | Curr. Eff. [Cd/A] | 70 | 69.9 | 71.7 | 69.9 | 71.7 |
| | CIE_x | 0.210 | 0.210 | 0.210 | 0.210 | 0.210 |
| | CIE_y | 0.730 | 0.730 | 0.730 | 0.730 | 0.730 |
| red | Curr. Eff. [Cd/A] | 33 | 27.2 | 27.2 | 37.13 | 37.13 |
| | CIE_x | 0.653 | 0.653 | 0.653 | 0.653 | 0.653 |
| | CIE_y | 0.323 | 0.323 | 0.323 | 0.323 | 0.323 |
| white [Cd/A] | | 26 | 29.1 | 29.3 | 31.6 | 31.9 |

FIG. 8

|  | blue (nm) | green (nm) | red (nm) |
|---|---|---|---|
| ETL 2 | 35 | 35 | 35 |
| EML 2 | 7 | 41 | 115.6 |
| green HLT | - | 12 | - |
| HTL 2 | 42 | 42 | 42 |
| CGL | 10 | 10 | 10 |
| ETL 1 | 35 | 35 | 35 |
| EML 1 | 19 | 19 | 19 |
| HTL 1 | 30 | 30 | 30 |
| HIL | 10 | 10 | 10 |
| Total Thickness | 188 | 234 | 296.6 |

FIG. 10

|  | blue (nm) | green (nm) | red (nm) |
|---|---|---|---|
| ETL 2 | 35 | 35 | 35 |
| EML 2 | 7 | 52 | 93.6 |
| red HLT | - | - | 10 |
| HTL 2 | 42 | 42 | 42 |
| CGL | 10 | 10 | 10 |
| ETL 1 | 35 | 35 | 35 |
| EML 1 | 19 | 19 | 19 |
| HTL 1 | 30 | 30 | 30 |
| HIL | 10 | 10 | 10 |
| Total Thickness | 188 | 234 | 284.6 |

FIG. 12

|  | blue (nm) | green (nm) | red (nm) |
|---|---|---|---|
| ETL 2 | 35 | 35 | 35 |
| EML 2 | 7 | 41 | 93.6 |
| red HTL | - | - | 10 |
| green HLT | - | 12 | - |
| HTL 2 | 42 | 42 | 42 |
| CGL | 10 | 10 | 10 |
| ETL 1 | 35 | 35 | 35 |
| EML 1 | 19 | 19 | 19 |
| HTL 1 | 30 | 30 | 30 |
| HIL | 10 | 10 | 10 |
| Total Thickness | 188 | 234 | 284.6 |

ORGANIC LIGHT EMITTING DEVICE

CROSS-REFERENCE TO RELATED APPLICATIONS

This application claims the benefit of Korean Patent Application No. 10-2013-0144759 filed on Nov. 26, 2013, which is hereby incorporated by reference as if fully set forth herein.

BACKGROUND OF THE INVENTION

Field of the Invention

The present invention relates to an organic light emitting device, and more particularly, to an organic light emitting device having a micro cavity emission structure in which emission efficiency and a service life are enhanced.

Discussion of the Related Art

To date, liquid crystal display (LCD) devices are being widely used as flat panel display devices. The LCD devices use a backlight as a separate light source, and have technical limitations in brightness and contrast. On the other hand, since organic light emitting devices self-emit light, the organic light emitting devices do not need a separate light source and have relatively better brightness, contrast, and viewing angle, and thus, interest in the organic light emitting devices is increasing. Also, since the organic light emitting devices do not use a backlight, the organic light emitting devices are manufactured to be light and thin, and have low power consumption and a fast response time.

The types of organic light emitting devices are categorized into a top emission type, a bottom emission type, and a dual emission type according to an emission direction of light. The organic light emitting devices are categorized into passive matrix organic light emitting devices and active matrix organic light emitting devices depending on a driving mode.

FIG. 1 is a diagram illustrating a red, green, and blue pixel structure of an organic light emitting device having a micro cavity structure of the related art. FIG. 1 illustrates a pixel structure of an active matrix organic light emitting device having a top emission type.

Referring to FIG. 1, the organic light emitting device includes an anode electrode 10, a cathode electrode 70, and an organic emission layer. The related art organic light emitting device has a structure in which the organic emission layer is formed between the cathode electrode 70 injecting an electron and the anode electrode 10 injecting a positive hole. A capping layer (CPL) 80 is formed on the cathode electrode 70.

In the micro cavity structure, the anode electrode 10 is formed as a reflective electrode, and the cathode electrode 70 is formed as a semi-transmissive electrode, thereby forming a micro cavity structure. An optical cavity is formed between the cathode electrode 70 and the anode electrode 10. The cathode electrode 70 transmits some (for example, 60% of all light) of light emitted from the organic emission layer, and the remaining light (for example, 40% of all light) which is not transmitted is reflected to cause constructive interference suitable for each wavelength, thereby enhancing emission efficiency.

The organic emission layer includes a hole injection layer (HIL) 20, a hole transport layer (HTL) 30, a plurality of emission layers (EMLs) 52, 54 and 56, an electron injection layer (EIL, not shown), and an electron transport layer (ETL) 60. In this case, the electron injection layer (EIL) may be omitted.

One unit pixel includes a red pixel Rp, a green pixel Gp, and a blue pixel Bp of three colors. The organic emission layer of the red pixel further includes a red HTL 42. The organic emission layer of the green pixel further includes a green HTL 44.

The red emission layer 52 of the red pixel Rp is formed between the ETL 60 and the red HTL 42. The green emission layer 54 of the green pixel Gp is formed between the ETL 60 and the green HTL 44. The blue emission layer 56 of the blue pixel Bp is formed between the ETL 60 and the HTL 30.

When an electron generated from the cathode electrode 70 and a positive hole generated from the anode electrode 10 are injected into the EMLs 52, 54 and 56, the injected electron and positive hole are combined to generate an exciton. The generated exciton is shifted from an excited state to a ground state to emit red light, green light, and blue light from the red EML 52, the green EML 54, and the blue EML 56.

Due to an emission structure and a material of the emission layer, the related art organic light emitting device has limitations in emission characteristic and a performance of a service life, and thus, a method has been proposed in which emission efficiency is enhanced by changing a fluorescent material, forming the emission layers 52, 54 and 56, to a phosphor material. However, the method has a problem in which power consumption increases in a case of increasing luminance Also, the method has a problem in which emission efficiency is lowered when a light emitting material is changed for securing a long service life.

As a resolution of a display device advances to a high resolution, the number of pixels per unit area increases, and high luminance is needed. However, due to an emission structure of an organic light emitting device, a luminance Cd of a unit area A is limited. Also, since a current increases for enhancing luminance, a reliability of a device is degraded, and consumption power increases.

Moreover, among pixels of three colors of the organic light emitting device, a blue pixel has a shorter service life than those of a red pixel and a green pixel, and in manufacturing a display panel having the pixels (red, green, and blue pixels) of three colors, a service life of the display panel cannot be ensured.

Therefore, in order to solve main causes that hinder a quality of a productivity of an organic light emitting device, it is required to overcome technical limitations in enhancing a service life and emission efficiency of a device and decreasing consumption power. Also, it is required to develop an organic light emitting device for reducing power consumption and enhancing emission efficiency and a service life of an emission layer.

SUMMARY OF THE INVENTION

Accordingly, the present invention is directed to provide an organic light emitting device that substantially obviates one or more problems due to limitations and disadvantages of the related art.

An object of the present invention is to provide an organic light emitting device in which emission efficiency is enhanced by using a micro cavity structure.

Another object of the present invention is to provide an organic light emitting device in which luminance is enhanced by using a micro cavity structure.

Another object of the present invention is to provide an organic light emitting device in which a service life is enhanced by using a micro cavity structure.

Additional features and advantages of the invention will be set forth in part in the description which follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an organic light emitting device, in which a micro cavity is disposed between a first electrode and a second electrode, includes a first emission unit configured to include a common blue emission material layer which is included in common in a plurality of pixels emitting lights having different wavelength ranges; a second emission unit configured to include a red emission material layer, a green emission material layer, and a blue emission material layer which respectively emit lights having different wavelength ranges; a charge generation layer disposed between the first emission unit and the second emission unit; a first electrode formed as a reflective electrode, and configured to supply an electric charge having a first polarity to the first emission unit and the second emission unit; and a second electrode formed as a semi-transmissive electrode, and configured to supply an electric charge having a second polarity to the first emission unit and the second emission unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 2 is a diagram illustrating a thickness of an organic emission layer (for example, ETL, EML, HTL, and HIL) formed on each of a red pixel, a green pixel, and a blue pixel of an organic light emitting device illustrated in FIG. 1;

FIG. 4 is a diagram illustrating a thickness of an organic emission layer formed in each of red, green, and blue pixels of an organic light emitting device according to a first embodiment of the present invention;

FIG. 5 is a diagram illustrating a result which is obtained by comparing an optical simulation result of an organic light emitting device according to a comparative example and an optical simulation result of an organic light emitting device according to first to fourth embodiments of the present invention;

FIG. 6 is a diagram illustrating luminance conversion data based the optical simulation result of the organic light emitting device according to the comparative example and the optical simulation result of the organic light emitting device according to the first to fourth embodiments of the present invention illustrated in FIG. 5;

FIG. 8 is a diagram illustrating a thickness of an organic emission layer formed in each of red, green, and blue pixels of an organic light emitting device according to a second embodiment of the present invention;

FIG. 10 is a diagram illustrating a thickness of an organic emission layer formed in each of red, green, and blue pixels of an organic light emitting device according to a third embodiment of the present invention;

FIG. 12 is a diagram illustrating a thickness of an organic emission layer formed in each of red, green, and blue pixels of an organic light emitting device according to a fourth embodiment of the present invention.

DETAILED DESCRIPTION OF THE ILLUSTRATED EMBODIMENTS

Figure 1:
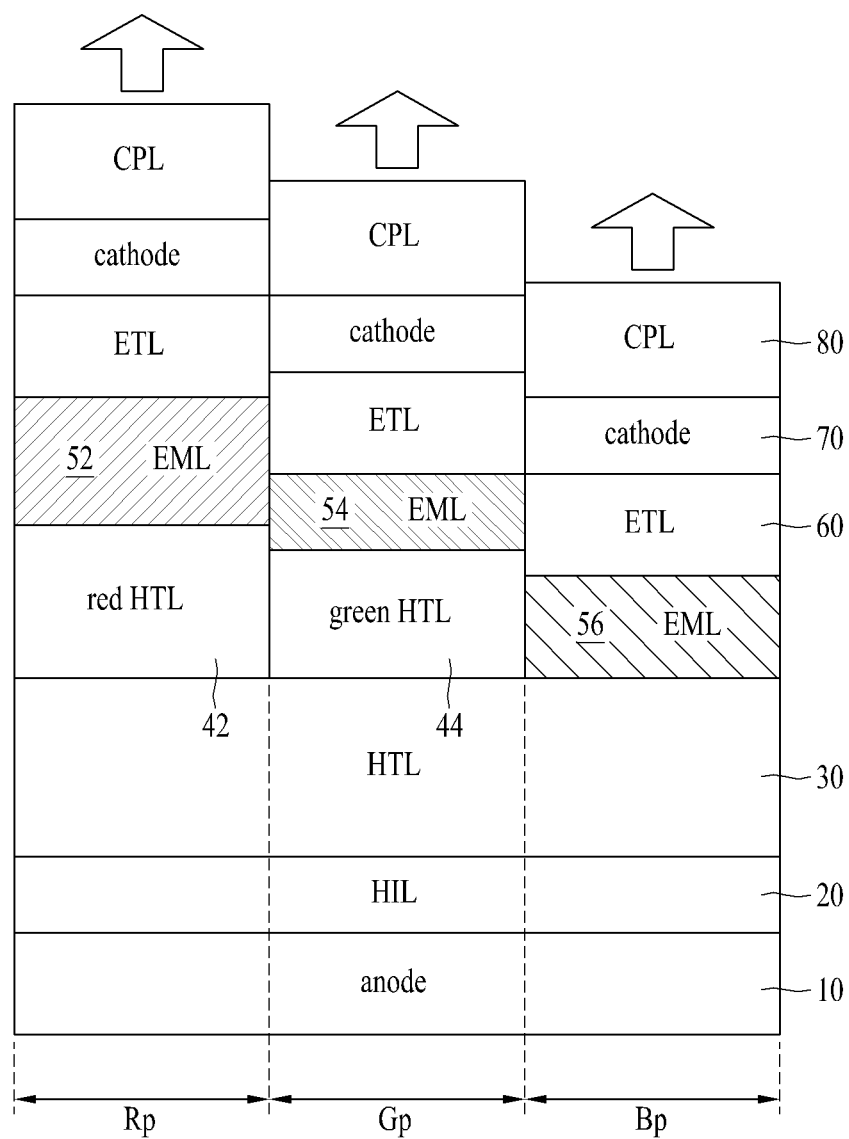
FIG. 1 is a diagram illustrating a red, green, and blue pixel structure of an organic light emitting device having a micro cavity structure of the related art.

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In description of embodiments of the present invention, when a structure is described as being formed at an upper portion/lower portion of another structure or on/under the other structure, this description should be construed as including a case where the structures contact each other and moreover a case where a third structure is disposed therebetween.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Before describing a pixel structure and a luminance characteristic of an organic light emitting device according to embodiments of the present invention, the related art organic light emitting device of FIG. 1 has been selected as a comparative example for analogizing an optical simulation result of the organic light emitting device according to embodiments of the present invention with actual luminance data.

Hereinafter, simulation data and actual luminance data of the comparative example will be described with reference to the drawings. Next, embodiments of the present invention will be described in detail.

COMPARATIVE EXAMPLE

An anode electrode 10 of the comparative example is a reflective electrode, and is formed in a structure where an indium tin oxide (ITO) layer (a thickness: 70 Å), a reflective layer (APC, a thickness: 100 Å), and an ITO layer (a thickness: 70 Å) are stacked. In this case, the reflective layer (APC) is formed of an alloy which contains silver (Ag) by 90% or more. The anode electrode 10 is formed in units of a unit pixel. One unit pixel is composed of a red pixel Rp, a green pixel Gp, and a blue pixel Bp of three colors, and the pixels of three colors are divided by a bank. An organic emission layer is formed under the following conditions, for a luminance measurement experiment of the comparative example.

A hole injection layer (HIL) 20 is formed by depositing HAT-CN on an anode electrode 10 to a thickness of 10 nm. A hole transport layer (HTL) 30 is formed by depositing NPD on the HIL 20 to a thickness of 114 nm.

A green HIL 44 is formed in a green pixel area Gp by depositing TPD to a thickness of 20 nm. A red HTL 42 is formed in a red pixel area Rp by depositing NPD to a thickness of 80 nm. Also, a layer is formed of TPD to have a thickness of 10 nm in a whole area.

Anthracene derivatives (a blue host (BH)) are formed to a thickness of 200 Å in a blue pixel area Bp. Furthermore, an emission material layer (EML) 52 of a blue pixel Bp is formed by doping Pyren derivatives (a blue dopant (BD)) by 5%.

CBP (a green host (GH)) is formed to a thickness of 40 nm in a green pixel area Gp. Furthermore, an emission material layer (EML) 54 of a green pixel Gp is formed by doping ppy$_2$Ir(acac) derivatives (a green dopant (GD)) by 5%.

Be complex derivatives (a red host (RH)) are formed to a thickness of 36 nm in a red pixel area Rp. Furthermore, an emission material layer (EML) 56 of a red pixel Rp is formed by doping btp2Ir(acac) (a red dopant (RD)) by 5%.

An ETL 60 is formed by doping Alq$_3$ on the EMLs 52, 54 and 56 to a thickness of 35 nm. A second electrode (a cathode electrode) 70 is formed by forming a LiF layer on the ETL 60 to a thickness of 15 Å and forming a Ag:Mg layer at a ratio of 1:1 to a thickness of 160 Å. The second electrode (the cathode electrode) 70 is formed as a semi-transmissive electrode. A capping layer 80 is formed by depositing NPD to a thickness of 65 nm to cover a pixel.

An organic emission layer is formed under the conditions, and then, a result which is obtained by actually measuring a luminance of a pixel is listed in the following Table 1.

TABLE 1

|  |  | blue | green | red |
|---|---|---|---|---|
| color | Curr. Eff. [Cd/A] | 3.5 | 70 | 33 |
|  | CIE_x | 0.138 | 0.210 | 0.653 |
|  | CIE_y | 0.050 | 0.730 | 0.323 |

Referring to Table 1, blue light having a luminance of 3.5 [Cd/A] is emitted from the blue pixel Bp, and it has been measured that, in color coordinates, CIE_x is 0.138, and CIE_y is 0.050.

Green light having a luminance of 70 [Cd/A] is emitted from the green pixel Gp, it has been measured that, in color coordinates, CIE_x is 0.210, and CIE_y is 0.730.

Red light having a luminance of 33 [Cd/A] is emitted from the red pixel Bp, it has been measured that, in color coordinates, CIE_x is 0.653 and CIE_y is 0.323.

FIG. 2 is a diagram illustrating a thickness of an organic emission layer (for example, ETL, EML, HTL, and HIL) formed on each of a red pixel, a green pixel, and a blue pixel of an organic light emitting device illustrated in FIG. 1.

In order to compare the comparative example of FIG. 1 and optical characteristics of embodiments of the present invention, an optical simulation has been performed on the assumption that an emission layer is formed under the conditions of FIG. 2. A result of the optical simulation is listed in the following Table 2. In this case, a pixel structure and a material of an organic emission layer are the same as those of FIG. 1.

Referring to FIG. 2, a hole injection layer (HIL) is formed to a thickness of 20 nm. A hole transport layer (HTL) of a blue pixel Bp is formed to a thickness of 123.4 nm. A hole transport layer (HTL) of a green pixel Gp is formed to a thickness of 143.5 nm. A hole transport layer (HTL) of a red pixel Rp is formed to a thickness of 193 nm.

An emission material layer (blue EML) of the blue pixel Bp is formed to a thickness of 20 nm. An emission material layer (green EML) of the green pixel Gp is formed to a thickness of 40 nm. An emission material layer (red EML) of the red pixel Rp is formed to a thickness of 36 nm. An electron transport layer (ETL) formed on an emission material layer (EML) is formed to a thickness of 35 nm.

An organic emission layer is formed under the conditions of FIG. 2, and then, optical simulation results of the red pixel Rp, the green pixel Gp, and the blue pixel Bp are listed in the following Table 2.

TABLE 2

|  |  | blue | green | red |
|---|---|---|---|---|
| color | Curr. Eff. [Cd/A] | 3.3109 | 32.9982 | 13.5796 |
|  | CIE_x | 0.1382 | 0.2117 | 0.6514 |
|  | CIE_y | 0.0451 | 0.7314 | 0.3474 |

Referring to Table 2, an optical simulation result in which blue light is emitted at a luminance of 3.3109 [Cd/A] is obtained in the blue pixel Bp. In this case, in color coordinates, CIE_x is 0.1382, and CIE_y is 0.0451.

An optical simulation result in which green light is emitted at a luminance of 32.9982 [Cd/A] is obtained in the green pixel Gp. In this case, in color coordinates, CIE_x is 0.2117, and CIE_y is 0.7314.

An optical simulation result in which red light is emitted at a luminance of 13.5796 [Cd/A] is obtained in the red pixel Rp. In this case, in color coordinates, CIE_x is 0.6514, and CIE_y is 0.3474.

Luminance characteristics of color lights respectively emitted from a red pixel, a green pixel, and a blue pixel of an organic light emitting device according to embodiments of the present invention and a luminance characteristic of white light may be analogized by considering a measurement result of an actual luminance and a pixel and an optical simulation result.

First Embodiment of the Present Invention

Figure 3:
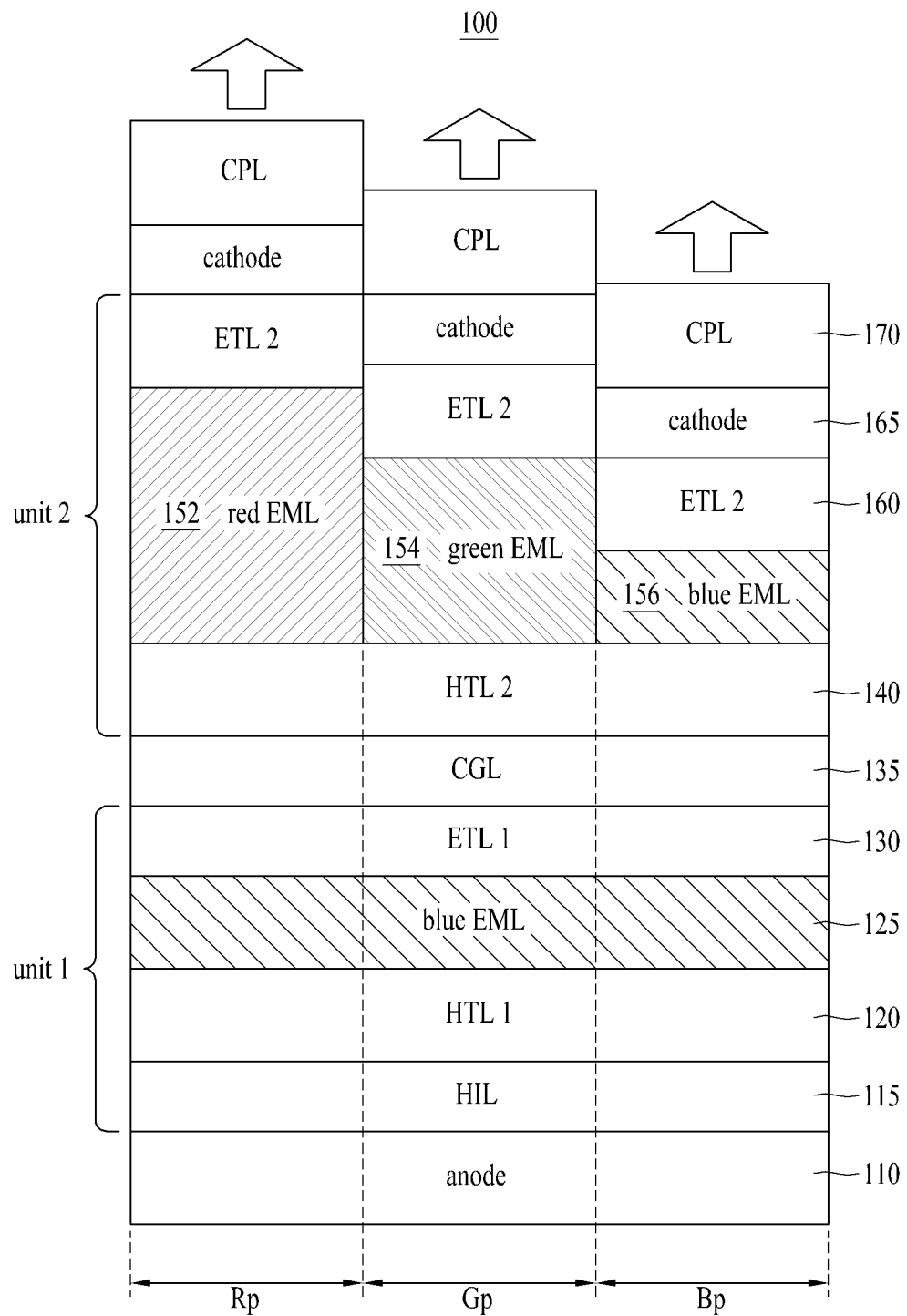
FIG. 3 is a diagram illustrating red, green, and blue pixel structures of an organic light emitting device according to a first embodiment of the present invention.

FIG. 3 is a diagram illustrating red, green, and blue pixel structures of an organic light emitting device 100 according to a first embodiment of the present invention. FIG. 3 illustrates a pixel structure having a top emission type to which a micro cavity structure is applied.

Referring to FIG. 3, the organic light emitting device 100 according to the first embodiment of the present invention includes a first electrode (an anode electrode) 110, a second electrode (a cathode electrode) 165, and an organic emission layer. The organic light emitting device has a structure in which the organic emission layer is formed between the first electrode (the anode electrode) 110 injecting a positive hole and the second electrode (the cathode electrode) 165 injecting an electron. A capping layer (CPL) 170 is formed on the second electrode (the cathode electrode) 165.

The organic light emitting device 100 according to the first embodiment of the present invention has a micro cavity structure, and one unit pixel includes a red pixel Rp, a green pixel Gp, and a blue pixel Bp of three colors.

The organic emission layer of the organic light emitting device 100 according to the first embodiment of the present invention is formed in a structure of two emission units (2unit). A first emission unit (unit1) of the organic emission layer has a structure that emits blue light. A second emission unit (unit2) of the organic emission layer has a structure that emits red light, green light, and blue light.

The first electrode (the anode electrode) 110 is formed as a reflective electrode, and the second electrode (the cathode electrode) 165 is formed as a semi-transmissive electrode, thereby forming a micro cavity.

Here, the first electrode (the anode electrode) 110 is the reflective electrode, and is formed in a structure where an ITO layer (a thickness: 70 Å), a reflective layer (APC, a thickness: 100 Å), and an ITO layer (a thickness: 70 Å) are stacked. In this case, APC is formed of an alloy which contains silver (Ag) by 90% or more.

A material of the APC may use palladium (Pd), copper (Cu), indium (In), or neodymium (Nd), in addition to Ag. Also, the material of the APC may use an alloy in which at least one selected from Pd, Cu, In, and Nd is added into Ag.

The first electrode (the anode electrode) 110 is formed in units of one unit pixel. One unit pixel is composed of a red pixel, a green pixel, and a blue pixel of three colors, and the pixels of three colors are divided by a bank (not shown).

An optical cavity is formed between the first electrode (the anode electrode) 110 and the second electrode (the cathode electrode) 165. The second electrode (the cathode electrode) 165 transmits some (for example, 60%) of light emitted from the organic emission layer, and light (for example, 40%) which is not transmitted is reflected to cause constructive interference suitable for each wavelength, thereby enhancing emission efficiency.

The organic emission layer include an HIL 115, a first HTL (HTL1) 120, a common blue EML 125, a first ETL (ETL1) 130, a charge generation layer (CGL) 135, a second HTL (HTL2) 140, a red EML 152, a green EML 154, a blue EML 156, and a second ETL (ETL2) 160. Although not shown, the organic emission layer may further include an EIL.

The HIL 115 is formed on the first electrode (the anode electrode) 110, and the first HTL (HTL1) 120 is formed on the HIL 115. The common blue EML 125 is formed on the first HTL (HTL1) 120. The first ETL (ETL1) 130 is formed on the common blue EML 125.

The charge generation layer (CGL) 135 is formed as an optical compensation layer on the first ETL (ETL1) 130. The second HTL (HTL2) 140 is formed on the CGL 135.

The red EML is formed on the second HTL (HTL2) 140 in a red pixel area Rp. The green EML 154 is formed on the second HTL (HTL2) 140 in a green pixel area Gp. The blue EML 156 is formed on the second HTL (HTL2) 140 in a blue pixel area Bp.

The second ETL (ETL2) 160 is formed on the red EML 152, the green EML 154, and the blue EML 156. The second electrode (the cathode electrode) 165 is formed on the second ETL (ETL2) 160. In this case, the second ETL (ETL2) 160 and the second electrode (the cathode electrode) 165 are formed all over the red pixel Rp, the green pixel Gp, and the blue pixel Bp.

Here, a first emission unit (unit1) of the organic emission layer includes the HIL 115, the first HTL (HTL1) 120, the common blue EML 125, and the first ETL (ETL1) 130.

A second emission unit (unit2) of the organic emission layer includes the second HTL (HTL2) 140, the red EML 152, the green EML 154, the blue EML 156, and the second ETL (ETL2) 160.

In the first emission unit (unit1), the common blue EML 125 is formed in the red pixel Rp, the green pixel Gp, and the blue pixel Bp in common Furthermore, the red EML 152, the green EML 154, and the blue EML 156 are formed in the second emission unit (unit2).

Each of the red pixel Rp, the green pixel Gp, and the blue pixel Bp has a micro cavity structure, and a thickness of an optical distance may be set by an EML.

An optical distance of a cavity structure is adjusted by using the elements of the second unit. Red light, green light, and blue light are emitted by adjusting a charge balance of a positive hole and an electron and an exciton generation area in which light is emitted in the EML.

FIG. 4 is a diagram illustrating a thickness of an organic emission layer formed in each of red, green, and blue pixels of an organic light emitting device according to a first embodiment of the present invention.

A thickness of the blue pixel Bp for amplifying a cavity of each emission wavelength area may be 1,500 Å to 2,000 Å. A thickness of the green pixel Gp may be 2,000 Å to 2,700 Å. A thickness of the red pixel Rp may be 2,500 Å to 3,100 Å.

Referring to FIG. 4, the HIL 115 is formed to the same thickness in the red pixel Rp, the green pixel Gp, and the blue pixel Bp. For example, the HIL 115 may be formed to a thickness of 10 nm.

The first HTL (HTL1) 120 is formed to the same thickness in the red pixel Rp, the green pixel Gp, and the blue pixel Bp. For example, the first HTL (HTL1) 120 may be formed to a thickness of 30 nm.

The first ETL (ETL1) 130 is formed to the same thickness in the red pixel Rp, the green pixel Gp, and the blue pixel Bp. For example, the first ETL (ETL1) 130 may be formed to a thickness of 35 nm.

The CGL 135 is formed to the same thickness in the red pixel Rp, the green pixel Gp, and the blue pixel Bp. For example, the CGL 135 may be formed to a thickness of 10 nm.

The second HTL (HTL2) 140 is formed to the same thickness in the red pixel Rp, the green pixel Gp, and the blue pixel Bp. For example, the second HTL (HTL2) 140 may be formed to a thickness of 42 nm.

The second ETL (ETL2) 160 is formed to the same thickness in the red pixel Rp, the green pixel Gp, and the blue pixel Bp. For example, the second ETL (ETL2) 160 may be formed to a thickness of 35 nm.

The second electrode (the cathode electrode) 165 which is the semi-transmissive electrode is formed to the same thickness in the red pixel Rp, the green pixel Gp, and the blue pixel Bp. For example, the second electrode (the cathode electrode) 165 is formed as the semi-transmissive electrode by forming a LiF layer on a second ETL (ETL2) 160 to a thickness of 15 Å and forming a Ag:Mg layer at a ratio of 1:1 to a thickness of 160 Å.

The common blue EML (EML1) 125 of the first emission unit (unit1) is formed to the same thickness in the red pixel Rp, the green pixel Gp, and the blue pixel Bp. For example, the common blue EML (EML1) 125 may be formed to a thickness of 19 nm to 31 nm.

In order to form an optical distance suitable for an emission wavelength of the red pixel Rp, the green pixel Gp, and the blue pixel Bp, a thickness of the EML (EML1) of the first emission unit (unit1) may differ from that of the EML (EML2) of the second emission unit (unit2). In this case, the EML (EML1) of the first emission unit (unit1) is formed to the same thickness in the red pixel Rp, the green pixel Gp, and the blue pixel Bp, and the thickness of the EML (EML2) of the second emission unit (unit2) may be adjusted.

For example, the red EML 152 of the red pixel Rp may be formed to a thickness of 115.6 nm. The green EML 154 of the green pixel Gp may be formed to a thickness of 53 nm. The blue EML 156 of the blue pixel Bp may be formed to a thickness of 7 nm to 19 nm.

Here, a color cavity is controlled for adjusting a color sense of red, green, and blue.

For example, a color cavity of the blue pixel Bp may be controlled by a thickness of the first HTL (HTL1) 120 of the first emission unit (unit1). A color cavity of the red pixel Rp may be controlled by a thickness of the red EML 152 of the second emission unit (unit2). Also, a color cavity of the green pixel Gp may be controlled by a thickness of the green EML 154.

A phosphor material forming the EML has a long service life, but is low in light efficiency. On the other hand, the phosphor material is high in light efficiency, but has a short service life.

In the organic light emitting device according to the first embodiment of the present invention, the first EML (EML1) and second EML (EML2) of the blue pixel Bp may be formed of different materials, for enhancing a light efficiency and a service life of the blue pixel Bp.

For example, the first EML (EML1) may be formed of a fluorescent material, and the second EML (EML2) may be formed of a phosphor material. As another example, the first EML (EML1) may be formed of a phosphor material, and the second EML (EML2) may be formed of a fluorescent material. That is, the common blue EML (EML1) 125 may be formed of a fluorescent material, and the common blue EML 156 may be formed of a phosphor material. On the other hand, the common blue EML (EML1) 125 may be formed of a phosphor material, and the common blue EML 156 may be formed of a fluorescent material.

Material of Organic Emission Layer

The HIL 115 may be formed of HAT-CN, TBAHA, F$_4$-TCNQ, or CuPc described in the following Formula 1.

[Formula 1]

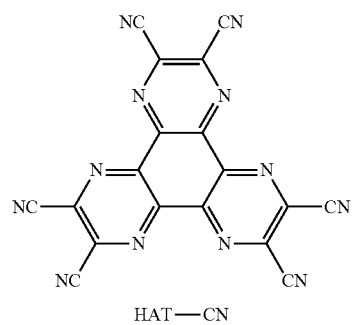

HAT—CN

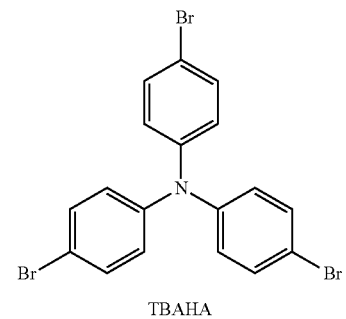

TBAHA

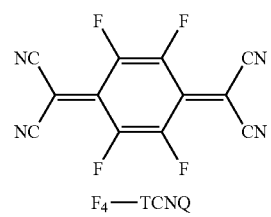

F$_4$—TCNQ

1p;2p

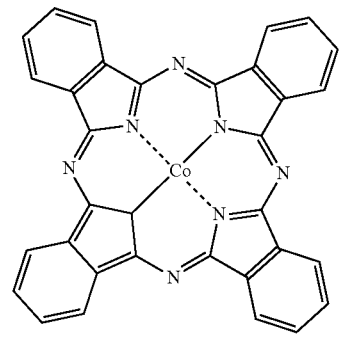

CuPc

The first ETL (ETL1) 140 and the second ETL (ETL2) 170 may be formed of spiro-PBD, BMB-3T, PF-6P, PyPySPyPy, COT, TPBI, oxadiazole derivatives, or Anthracene derivatives described in the following Formulas 2 to 9.

[Formula 2]
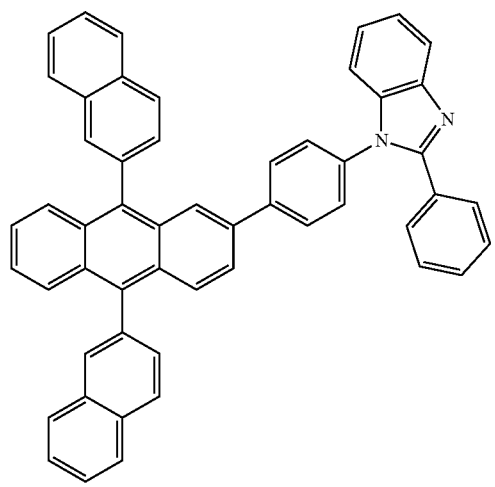
[Formula 3]
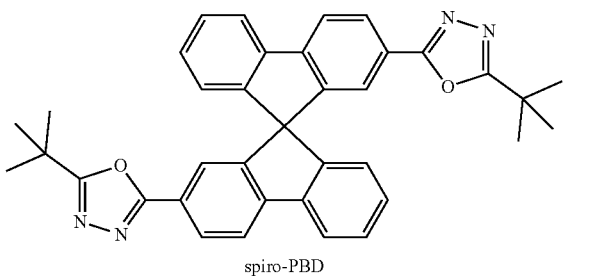
spiro-PBD
[Formula 4]
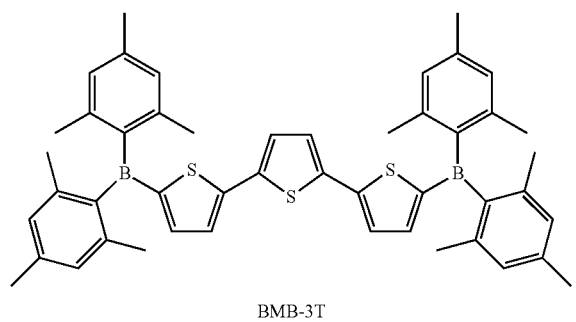
BMB-3T
[Formula 5]
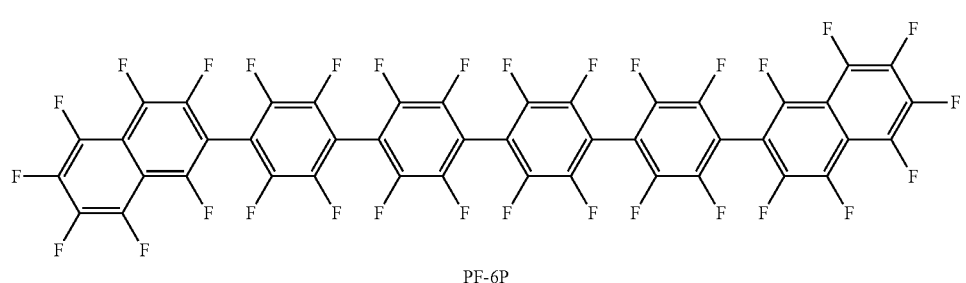
PF-6P
[Formula 6]
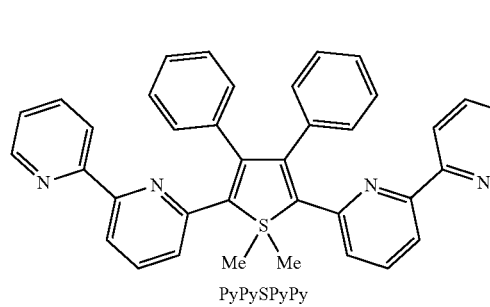
PyPySPyPy
[Formula 7]
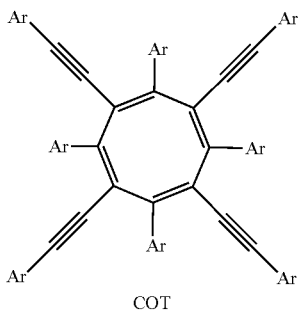
COT

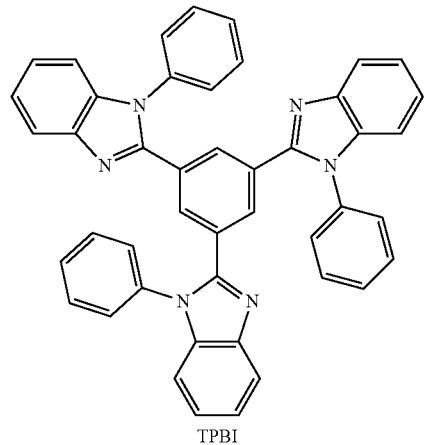
TPBI
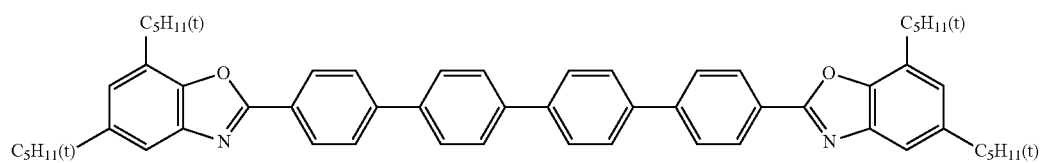
A phosphor material of the blue EML may use materials of the following Formulas 10 to 17.
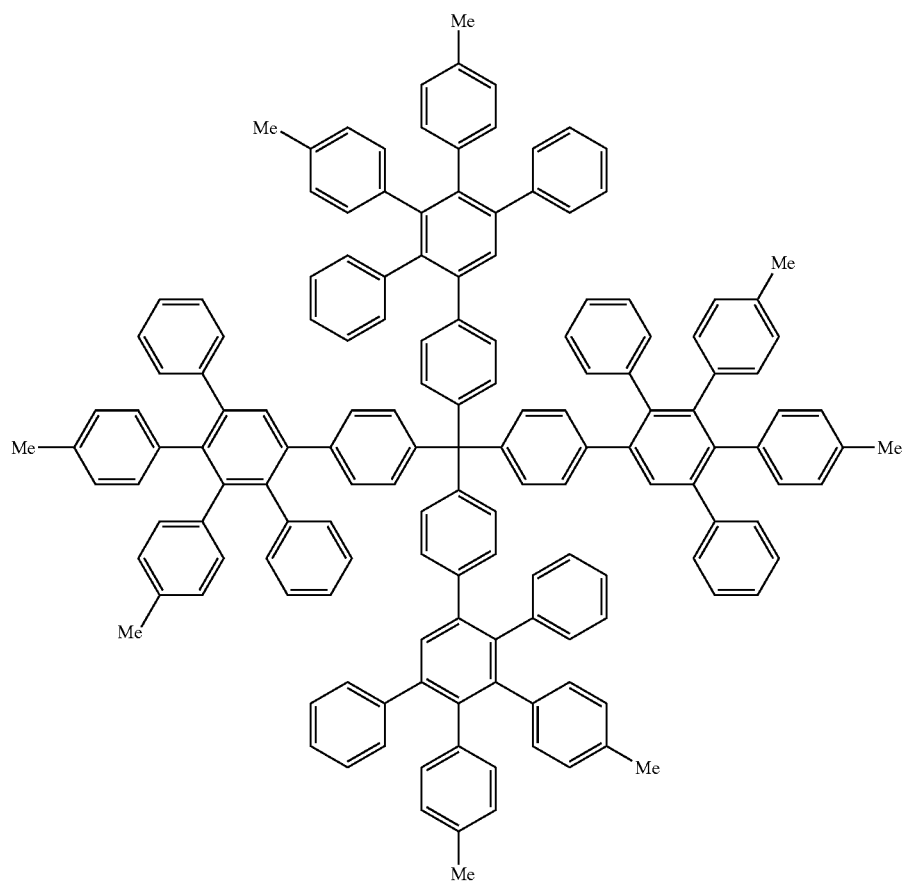

-continued
[Formula 11]
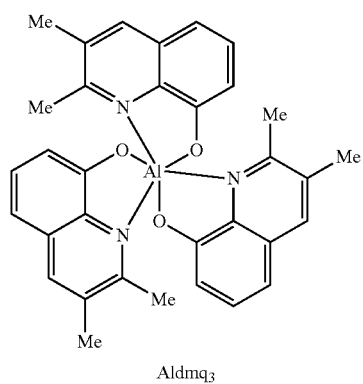
Aldmq₃
[Formula 12]
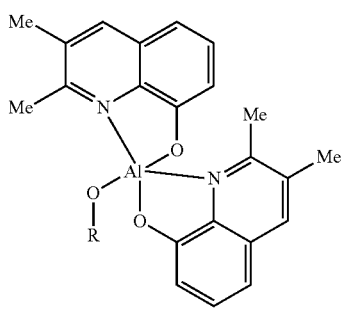
SAlq/Aldmq₂OH
[Formula 13]
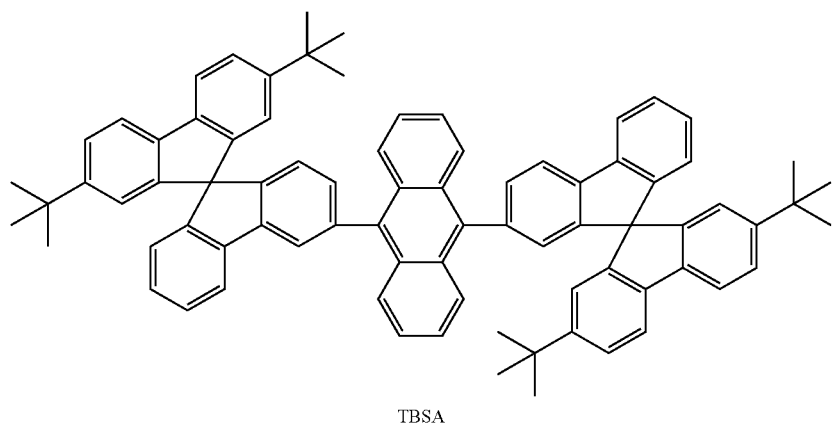
TBSA
[Formula 14]
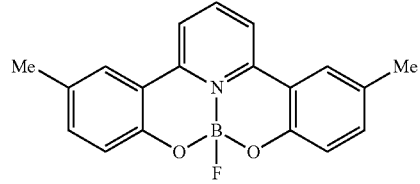
(mdppy)BF
[Formula 15]
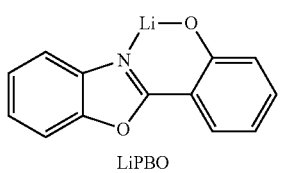
LiPBO
[Formula 16]
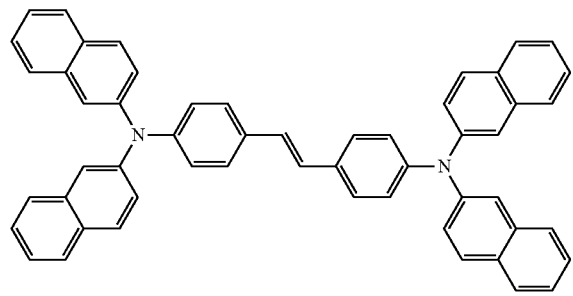
[Formula 17]
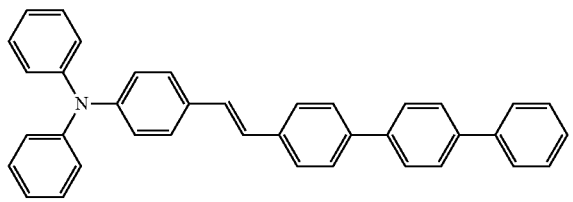

A host (BH) of a blue fluorescent material may use a material of the following Formula 18.

[Formula 18]

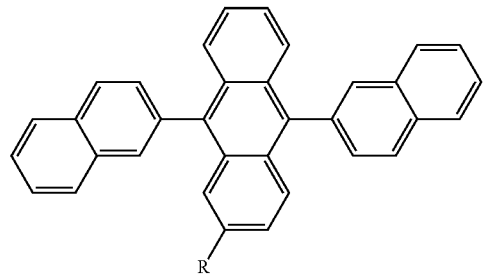

A dopant (BD) of the blue fluorescent material may use a material of the following Formula 19.

[Formula 19]

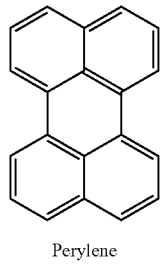

Perylene

However, the present embodiment is not limited thereto. A material of the blue EML may use DAS, DSA-amin, 1-DNA, DNA/mADN/TBADN, or spiro-oligo(phenylene), and a light emitting material having various structures and various derivatives may be applied.

A green fluorescent material may use materials of the following Formulas 20 to 25.

[Formula 20]

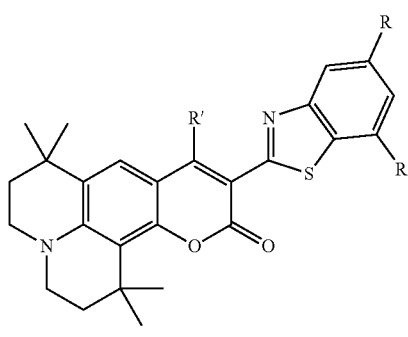

C545T

[Formula 21]

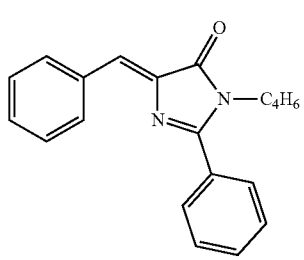

[Formula 22]

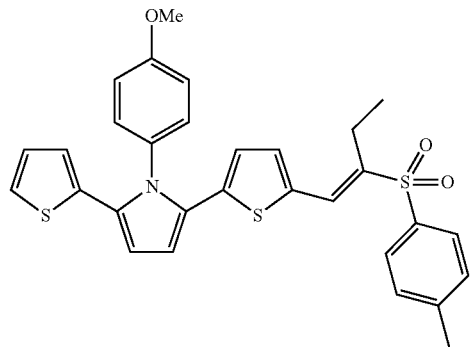

[Formula 23]

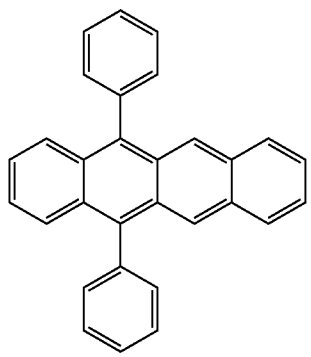

[Formula 24]

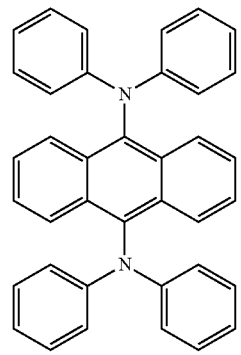

[Formula 25]

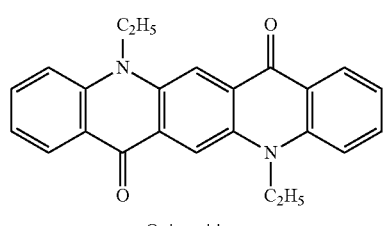

Quinacridone

A red fluorescent material may use materials of the following Formulas 26 to 30.

[Formula 26]
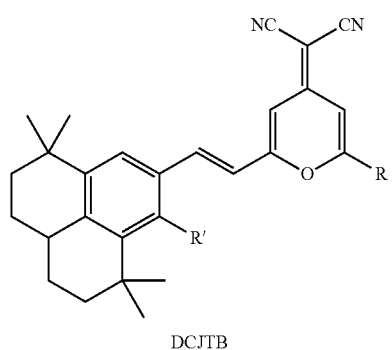
DCJTB
[Formula 27]
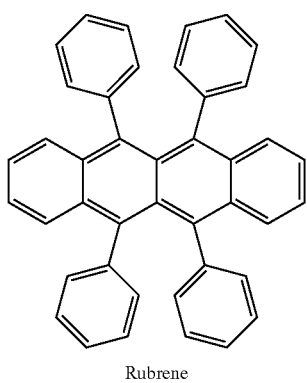
Rubrene
[Formula 28]
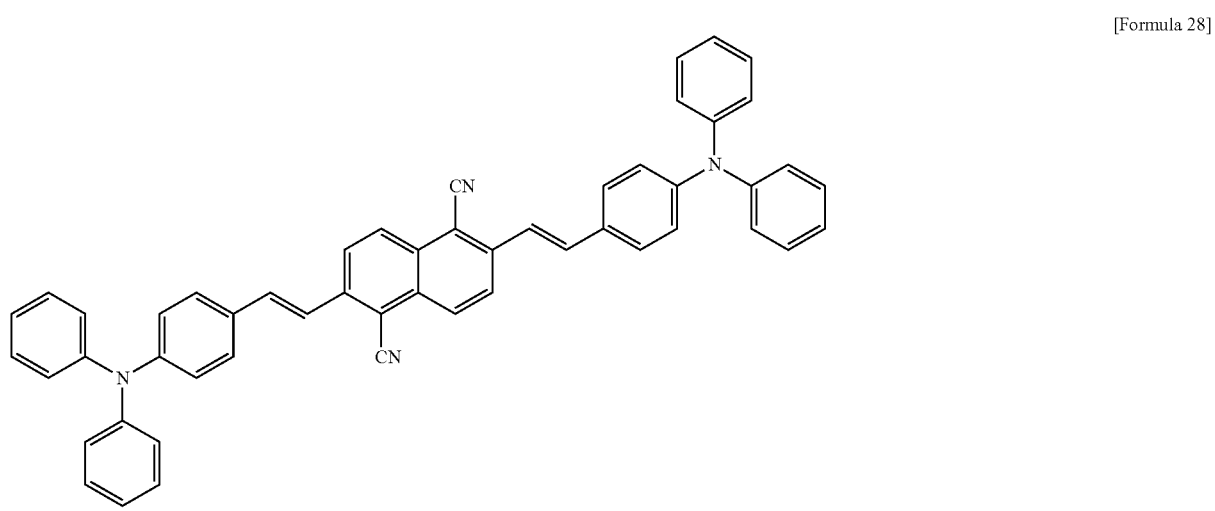
[Formula 29]
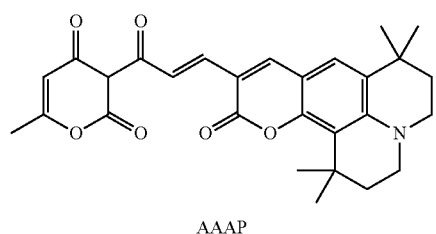
AAAP
[Formula 30]
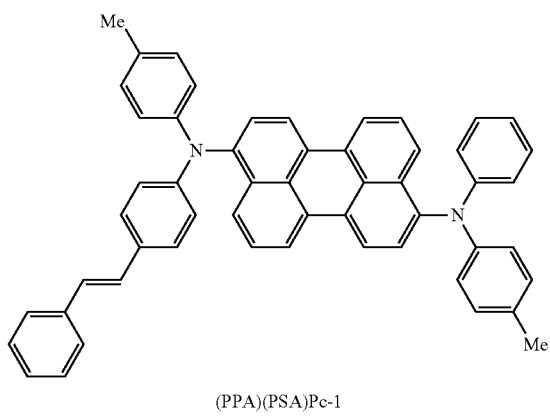
(PPA)(PSA)Pc-1

A host of a phosphor material of the blue EML may use materials of the following Formulas 31 to 37.
[Formula 31]
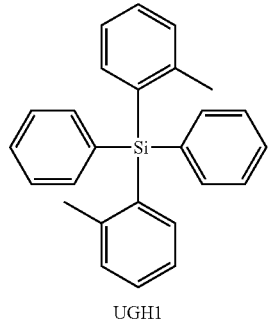
UGH1
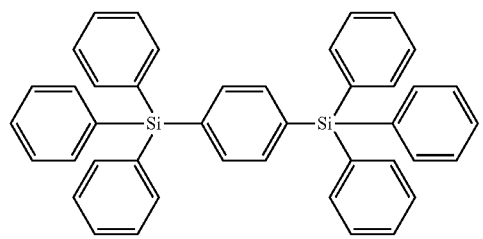
UGH2
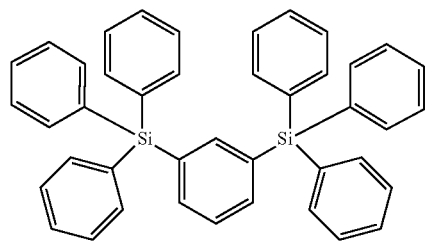
UGH3
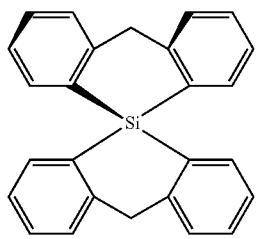
UGH4
[Formula 32]
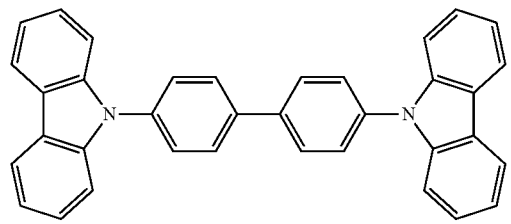
CBP
[Formula 33]
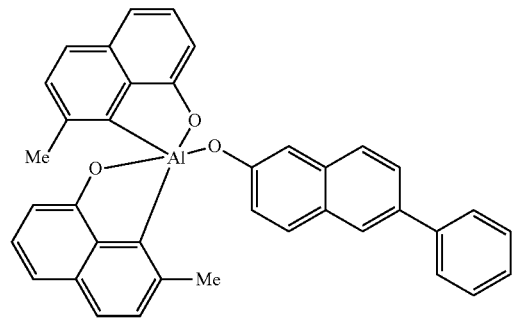
BAlq'
[Formula 34]
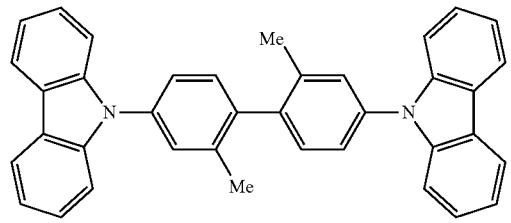
CDBP
[Formula 35]
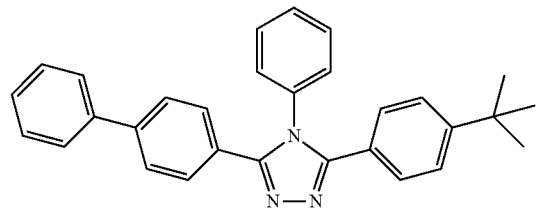
TAZ

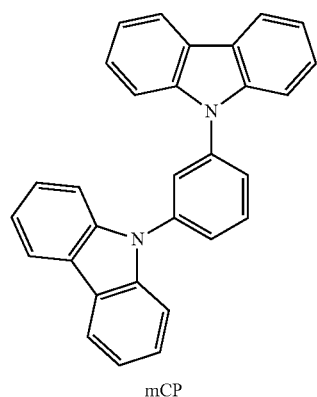
mCP
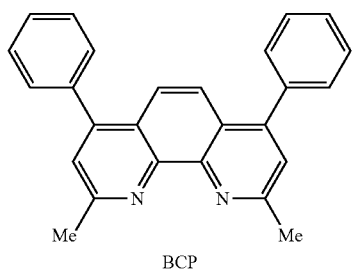
BCP
A host of a phosphor material of each of the red EML and the green EML may use materials of the following Formulas 38 to 44.
[Formula 38]
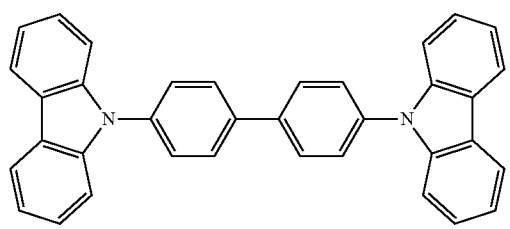
CBP
[Formula 41]
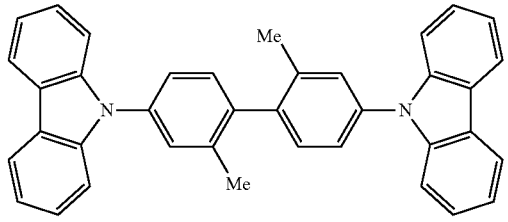
CDBP
[Formula 39]
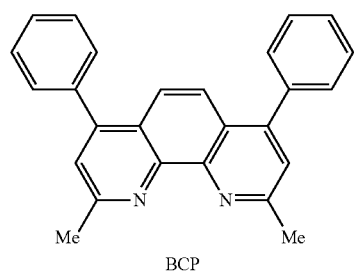
BCP
[Formula 42]
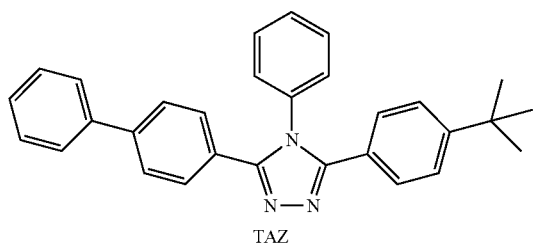
TAZ
[Formula 40]
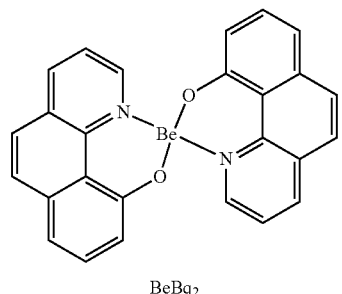
BeBq$_2$
[Formula 43]
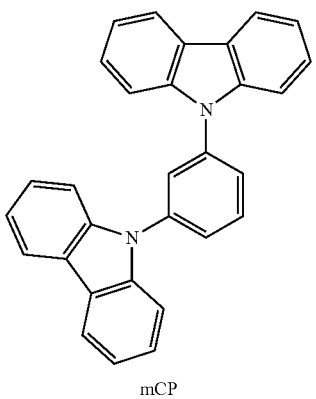
mCP

[Formula 44]

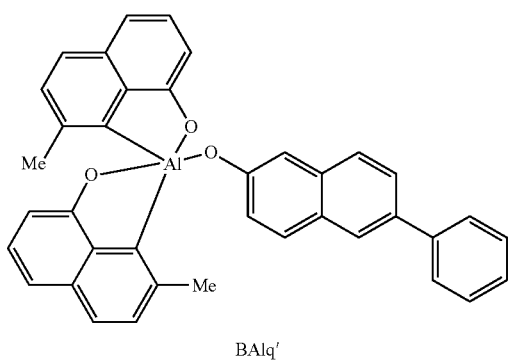

BAlq'

A dopant of a phosphor material of the red EML may use a material of the following Formula 45.

[Formula 45]

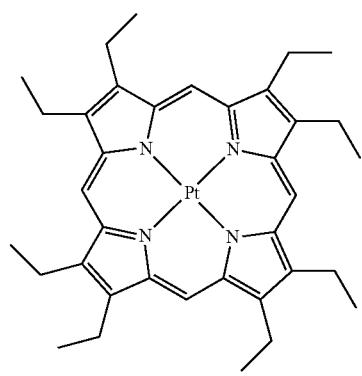

PtOEP
(650 nm)

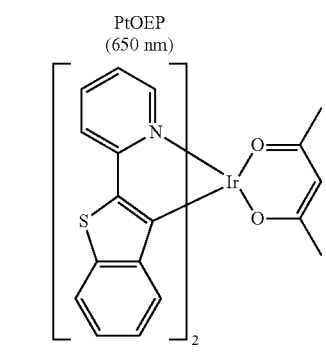

btp₂Ir(acac)
(616 nm)

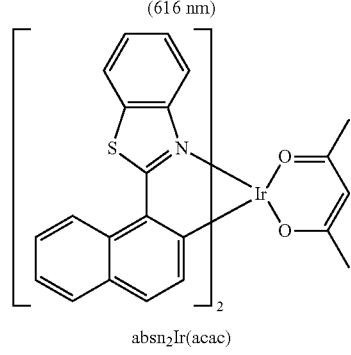

absn₂Ir(acac)
(602 nm)

A dopant of a phosphor material of the green EML may use a material of the following Formula 46.

[Formula 46]

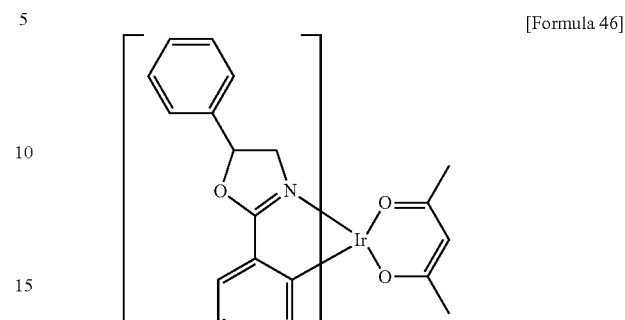

dp₂Ir(acac)
(550 nm)

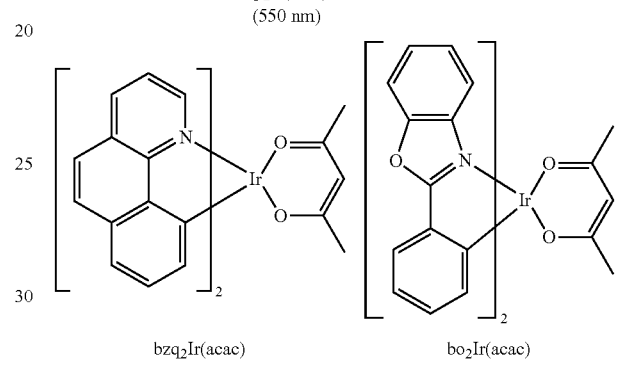

bzq₂Ir(acac)　　　bo₂Ir(acac)
(548 nm)　　　　(525 nm)

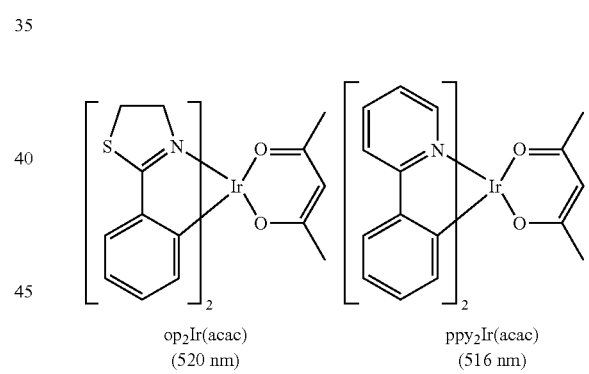

op₂Ir(acac)　　　ppy₂Ir(acac)
(520 nm)　　　　(516 nm)

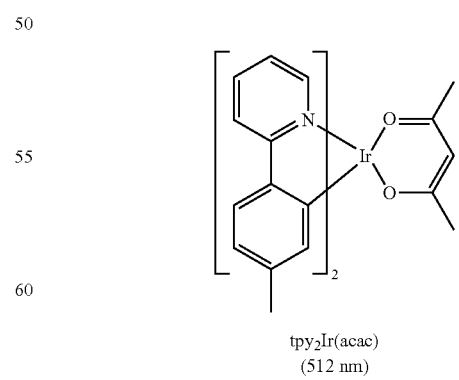

tpy₂Ir(acac)
(512 nm)

A dopant of a phosphor material of the blue EML may use a material of the following Formula 47.

[Formula 47]

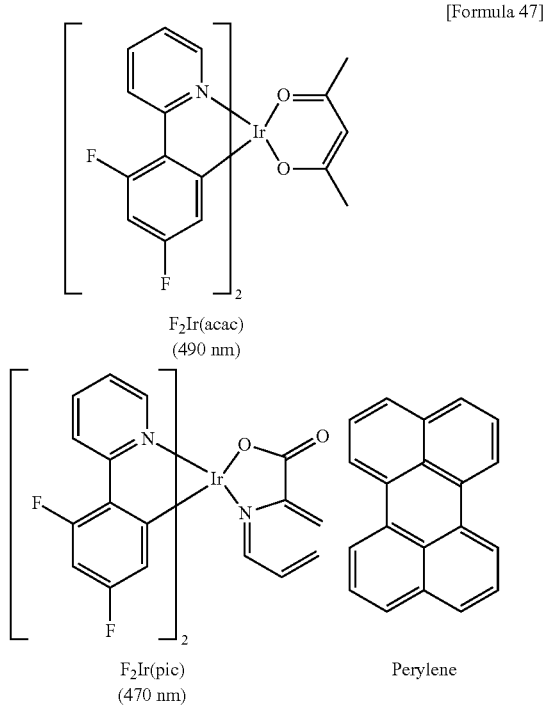

F₂Ir(acac)
(490 nm)

F₂Ir(pic)        Perylene
(470 nm)

However, the present embodiment is not limited thereto. For example, a host of a phosphor material may be changed to various derivatives, and a dopant of a phosphor material may contain Ir complex.

At least one selected from the EML (ELM1) of the first emission unit (unit1) and the EML (ELM2) of the second emission unit (unit2) may be formed by mixing two or more kinds of hosts. Also, at least one selected from the EML (ELM1) of the first emission unit (unit1) and the EML (ELM2) of the second emission unit (unit2) may be formed by mixing two or more kinds of dopants.

Referring again to FIGS. 4 and 5, blue light is emitted from the common blue EML (EML1) 125 in the first unit. In this case, in the red pixel Rp and the green pixel Gp, the blue light is depleted by a control of a color cavity (an optical distance of a micro cavity and charge balance). However, in the blue pixel Bp, the blue light is not depleted but is amplified by the micro cavity.

In the second emission unit (unit2), red light is emitted from the red pixel Rp, green light is emitted from the green pixel Gp, and blue light is emitted from the blue pixel Bp. Also, the red light, the green light, and the blue light pass through the second electrode (the cathode electrode) 165, and are output to the outside. In this case, the blue light generated from the first emission unit (unit1) and the blue light generated from the second emission unit (unit2) are summated in the blue pixel Bp, and thus, an efficiency of the blue light is enhanced. Also, a service life of the blue pixel Bp increases.

Optical Simulation Result of First Embodiment of the Present Invention

The conditions of the pixel structures illustrated in FIGS. 4 and 5 are applied to optical simulation equipment (Setfos 3.3 of FLUXim Company), and an optical simulation of the organic light emitting device according to the first embodiment of the present invention has been performed.

An organic emission layer is formed under the conditions of FIG. 4, and then, optical simulation results of the red pixel, the green pixel, and the blue pixel are listed in the following Table 3.

TABLE 3

|  |  | blue | green | red |
|---|---|---|---|---|
|  | Curr. Eff. [Cd/A] | 4.4301 | 32.9466 | 11.2008 |
| color | CIE_x | 0.1376 | 0.2142 | 0.653 |
|  | CIE_y | 0.0499 | 0.6799 | 0.308 |

Referring to Table 3, an optical simulation result in which blue light is emitted at a luminance of 4.4301 [Cd/A] is obtained in the blue pixel Bp. In this case, in color coordinates, CIE_x is 0.1376, and CIE_y is 0.0499.

An optical simulation result in which green light is emitted at a luminance of 32.99466 [Cd/A] is obtained in the green pixel Gp. In this case, in color coordinates, CIE_x is 0.2142, and CIE_y is 0.6799.

An optical simulation result in which red light is emitted at a luminance of 11.2008 [Cd/A] is obtained in the red pixel Rp. In this case, in color coordinates, CIE_x is 0.653, and CIE_y is 0.308.

Luminance characteristics of color lights, emitted from a red pixel, a green pixel, and a blue pixel of an organic light emitting device according to embodiments of the present invention, and a luminance characteristic of white light can be analogized by using an optical simulation result.

FIG. 5 is a diagram illustrating a result which is obtained by comparing an optical simulation result of an organic light emitting device according to a comparative example and an optical simulation result of an organic light emitting device according to first to fourth embodiments of the present invention. FIG. 6 is a diagram illustrating luminance conversion data based the optical simulation result of the organic light emitting device according to the comparative example and the optical simulation result of the organic light emitting device according to the first to fourth embodiments of the present invention illustrated in FIG. 5.

Referring to FIGS. 5 and 6, by comparing the comparative example (FIGS. 1 and 2) and an optical simulation result of the organic light emitting device according to the first embodiment of the present invention, it can be seen that a luminance of blue light, in which emission efficiency is the lowest, is enhanced in similar color coordinates.

Analogizing actual luminance on the basis of an optical simulation result, the blue pixel Bp of the organic light emitting device of the comparative example obtains an emission efficiency of 3.5 [Cd/A]. The blue pixel Bp of the organic light emitting device according to the first embodiment of the present invention obtains an emission efficiency of 4.8 [Cd/A]. That is, an emission efficiency of the blue pixel Bp is enhanced by 37% or more.

Moreover, since the emission efficiency of the blue pixel Bp is enhanced, an efficiency of white light is also enhanced from 26 [Cd/A] to 29.1 [Cd/A], and thus, in comparison with the comparative example, the efficiency of the white light is enhanced by about 12%.

Second Embodiment of the Present Invention

Figure 7:
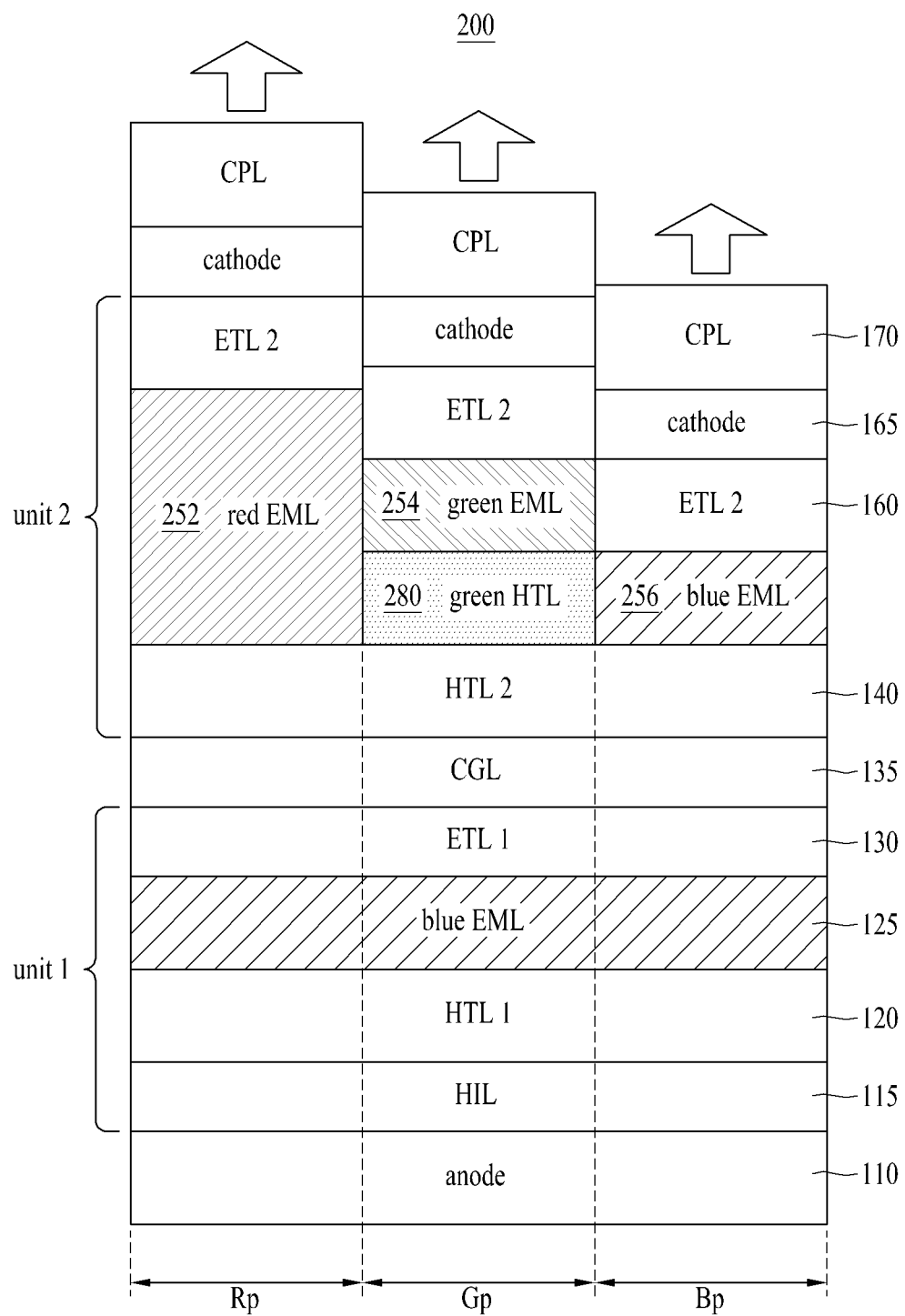
FIG. 7 is a diagram illustrating red, green, and blue pixel structures of an organic light emitting device according to a second embodiment of the present invention.

FIG. 7 is a diagram illustrating red, green, and blue pixel structures of an organic light emitting device 200 according to a second embodiment of the present invention. FIG. 7 illustrates a pixel structure having a top emission type to which a micro cavity structure is applied.

In describing a pixel structure of the organic light emitting device according to the second embodiment of the present invention, detailed descriptions on the same elements as those of the first embodiment of the present invention described above with reference to FIGS. 3 and 4 may not be provided.

Referring to FIG. 7, the organic light emitting device 200 according to the second embodiment of the present invention includes a first electrode (an anode electrode) 110, a second electrode (a cathode electrode) 165, and an organic emission layer. The organic light emitting device has a structure in which the organic emission layer is formed between the first electrode (the anode electrode) 110 injecting a positive hole and the second electrode (the cathode electrode) 165 injecting an electron. A capping layer (CPL) 170 is formed on the second electrode (the cathode electrode) 165.

The organic emission layer of the organic light emitting device 200 according to the second embodiment of the present invention is formed in a structure of two emission units (2unit). A first emission unit (unit1) of the organic emission layer has a structure that emits blue light. A second emission unit (unit2) of the organic emission layer has a structure that emits red light, green light, and blue light.

The first electrode (the anode electrode) 110 is formed as a reflective electrode, and the second electrode (the cathode electrode) 165 is formed as a semi-transmissive electrode, thereby forming a micro cavity.

The organic emission layer of the organic light emitting device 200 according to the second embodiment of the present invention include an HIL 115, a first HTL (HTL1) 120, a common blue EML 125, a first ETL (ETL1) 130, a charge generation layer (CGL) 135, a second HTL (HTL2) 140, a red EML 252, a green EML 254, a blue EML 256, and a second ETL (ETL2) 160. Also, the organic emission layer of the organic light emitting device 200 according to the second embodiment of the present invention may further include a green HTL 280 of a green pixel Gp.

The HIL 115 is formed on the first electrode (the anode electrode) 110, and the first HTL (HTL1) 120 is formed on the HIL 115. The common blue EML 125 is formed on the first HTL (HTL1) 120. The first ETL (ETL1) 130 is formed on the common blue EML 125.

The charge generation layer (CGL) 135 is formed as an optical compensation layer on the first ETL (ETL1) 130. The second HTL (HTL2) 140 is formed on the CGL 135.

The red EML 252 is formed on the second HTL (HTL2) 140 in a red pixel area Rp. The green HTL 280 is formed on the second HTL (HTL2) 140 in a green pixel area Gp. The green EML 254 is formed on the green HTL 280. The blue EML 256 is formed on the second HTL (HTL2) 140 in a blue pixel area Bp.

The second ETL (ETL2) 160 is formed on the red EML 252, the green EML 254, and the blue EML 256. The second electrode (the cathode electrode) 165 is formed on the second ETL (ETL2) 160.

Here, a first emission unit (unit1) of the organic emission layer includes the HIL 115, the first HTL (HTL1) 120, the common blue EML 125, and the first ETL (ETL1) 130.

A second emission unit (unit2) of the organic emission layer includes the second HTL (HTL2) 140, the red EML 252, the green EML 254, the blue EML 256, the green HTL 280, and the second ETL (ETL2) 160.

In the first emission unit (unit1), the common blue EML 125 is formed in the red pixel Rp, the green pixel Gp, and the blue pixel Bp in common Furthermore, the red EML 252, the green EML 254, and the blue EML 256 are formed in the second emission unit (unit2).

Each of the red pixel Rp, the green pixel Gp, and the blue pixel Bp has a micro cavity structure, and a thickness of an optical distance may be set by an EML.

An optical distance of a cavity structure is adjusted by using the elements of the second unit. Red light, green light, and blue light are emitted by adjusting a charge balance of a positive hole and an electron and an exciton generation area in which light is emitted in the EML.

In comparison with the first embodiment of the present invention, according to the second embodiment of the present invention, the green HTL 280 is further formed in the green pixel Gp, and thus, a thickness of the green EML 254 of the green pixel Gp is changed.

FIG. 8 is a diagram illustrating a thickness of an organic emission layer formed in each of red, green, and blue pixels of an organic light emitting device according to a second embodiment of the present invention.

A thickness of the blue pixel Bp for amplifying a cavity of each emission wavelength area may be 1,500 Å to 2,000 Å. A thickness of the green pixel Gp may be 2,000 Å to 2,700 Å. A thickness of the red pixel Rp may be 2,500 Å to 3,100 Å.

Referring to FIG. 8, the HIL 115 is formed to the same thickness in the red pixel Rp, the green pixel Gp, and the blue pixel Bp. For example, the HIL 115 may be formed to a thickness of 10 nm.

The first HTL (HTL1) 120 is formed to the same thickness in the red pixel Rp, the green pixel Gp, and the blue pixel Bp. For example, the first HTL (HTL1) 120 may be formed to a thickness of 30 nm.

The first ETL (ETL1) 130 is formed to the same thickness in the red pixel Rp, the green pixel Gp, and the blue pixel Bp. For example, the first ETL (ETL1) 130 may be formed to a thickness of 35 nm.

The CGL 135 is formed to the same thickness in the red pixel Rp, the green pixel Gp, and the blue pixel Bp. For example, the CGL 135 may be formed to a thickness of 10 nm.

The second HTL (HTL2) 140 is formed to the same thickness in the red pixel Rp, the green pixel Gp, and the blue pixel Bp. For example, the second HTL (HTL2) 140 may be formed to a thickness of 42 nm.

The second ETL (ETL2) 160 is formed to the same thickness in the red pixel Rp, the green pixel Gp, and the blue pixel Bp. For example, the second ETL (ETL2) 160 may be formed to a thickness of 35 nm.

Moreover, the first electrode (the anode electrode) 110 is the reflective electrode, and is formed in a structure where an ITO layer (a thickness: 70 Å), a reflective layer (APC, a thickness: 100 Å), and an ITO layer (a thickness: 70 Å) are stacked. In this case, APC is formed of an alloy which contains silver (Ag) by 90% or more.

The second electrode (the cathode electrode) 165 which is the semi-transmissive electrode is formed to the same thickness in the red pixel Rp, the green pixel Gp, and the blue pixel Bp. For example, the second electrode (the cathode electrode) 165 is formed as the semi-transmissive electrode by forming a LiF layer on a second ETL (ETL2) 160 to a thickness of 15 Å and forming a Ag:Mg layer at a ratio of 1:1 to a thickness of 160 Å.

The common blue EML (EML1) 125 of the first emission unit (unit1) is formed to the same thickness in the red pixel Rp, the green pixel Gp, and the blue pixel Bp. For example, the common blue EML (EML1) 125 may be formed to a thickness of 19 nm to 31 nm.

The green HTL 280 of the green pixel Gp is formed to a thickness of 12 nm.

In order to form an optical distance suitable for an emission wavelength of the red pixel Rp, the green pixel Gp, and the blue pixel Bp, a thickness of the EML (EML1) of the first emission unit (unit1) may differ from that of the EML (EML2) of the second emission unit (unit2). In this case, the EML (EML1) of the first emission unit (unit1) is formed to the same thickness in the red pixel Rp, the green pixel Gp, and the blue pixel Bp, and the thickness of the EML (EML2) of the second emission unit (unit2) may be adjusted.

Optical distances of micro cavities of the red pixel Rp, the green pixel Gp, and the blue pixel Bp are satisfied by thicknesses of the red EML of the red pixel Rp, the green EML of the green pixel Gp, and the blue EML of the blue pixel Bp.

For example, the red EML 252 of the red pixel Rp may be formed to a thickness of 115.6 nm. The green EML 254 of the green pixel Gp may be formed to a thickness of 41 nm. The blue EML 256 of the blue pixel Bp may be formed to a thickness of 7 nm to 19 nm.

Here, a color cavity is controlled for adjusting a color sense of red, green, and blue.

For example, a color cavity of the blue pixel Bp may be controlled by a thickness of the first HTL (HTL1) 120 of the first emission unit (unit1). A color cavity of the red pixel Rp may be controlled by a thickness of the red EML 252 of the second emission unit (unit2). Also, a color cavity of the green pixel Gp may be controlled by a thickness of the green EML 254.

Here, in the green pixel Gp, the green HTL 280 is formed to a thickness of 12 nm, and a thickness of the green EML 254 is adjusted.

A phosphor material forming the EML has a long service life, but is low in light efficiency. On the other hand, the phosphor material is high in light efficiency, but has a short service life.

In the organic light emitting device according to the second embodiment of the present invention, the first EML (EML1) and second EML (EML2) of the blue pixel Bp may be formed of different materials, for enhancing a light efficiency and a service life of the blue pixel Bp.

For example, the first EML (EML1) may be formed of a fluorescent material, and the second EML (EML2) may be formed of a phosphor material. As another example, the first EML (EML1) may be formed of a phosphor material, and the second EML (EML2) may be formed of a fluorescent material. That is, the common blue EML (EML1) 125 may be formed of a fluorescent material, and the blue EML 256 may be formed of a phosphor material. On the other hand, the common blue EML (EML1) 125 may be formed of a phosphor material, and the blue EML 256 may be formed of a fluorescent material.

Blue light is emitted from the common blue EML (EML1) 125 in the first unit. In this case, in the red pixel Rp and the green pixel Gp, the blue light is depleted by a control of a color cavity (an optical distance of a micro cavity and charge balance). However, in the blue pixel Bp, the blue light is not depleted but is amplified by the micro cavity.

In the second emission unit (unit2), red light is emitted from the red pixel Rp, green light is emitted from the green pixel Gp, and blue light is emitted from the blue pixel Bp. Also, the red light, the green light, and the blue light pass through the second electrode (the cathode electrode) 165, and are output to the outside. In this case, the blue light generated from the first emission unit (unit1) and the blue light generated from the second emission unit (unit2) are summated in the blue pixel Bp, and thus, an efficiency of the blue light is enhanced. Also, a service life of the blue pixel Bp increases.

Optical Simulation Result of Second Embodiment of the Present Invention

Referring again to FIGS. 5 and 6, the conditions of the pixel structures illustrated in FIGS. 7 and 8 are applied to optical simulation equipment (Setfos 3.3 of FLUXim Company), and an optical simulation of the organic light emitting device according to the second embodiment of the present invention has been performed. An organic emission layer is formed under the conditions of FIG. 8, and then, optical simulation results of the red pixel, the green pixel, and the blue pixel are listed in the following Table 4.

TABLE 4

|  |  | blue | green | red |
|---|---|---|---|---|
| Curr. Eff. [Cd/A] |  | 4.4301 | 33.8095 | 11.2008 |
| color | CIE_x | 0.1376 | 0.2151 | 0.653 |
|  | CIE_y | 0.0499 | 0.6779 | 0.308 |

Referring to Table 4, an optical simulation result in which blue light is emitted at a luminance of 4.4301 [Cd/A] is obtained in the blue pixel Bp. In this case, in color coordinates, CIE_x is 0.1376, and CIE_y is 0.0499.

An optical simulation result in which green light is emitted at a luminance of 33.8095 [Cd/A] is obtained in the green pixel Gp. In this case, in color coordinates, CIE_x is 0.2151, and CIE_y is 0.6799.

An optical simulation result in which red light is emitted at a luminance of 11.2008 [Cd/A] is obtained in the red pixel Rp. In this case, in color coordinates, CIE_x is 0.653, and CIE_y is 0.308.

Luminance characteristics of color lights, emitted from a red pixel, a green pixel, and a blue pixel of an organic light emitting device according to embodiments of the present invention, and a luminance characteristic of white light can be analogized by using an optical simulation result.

Comparing the comparative example (FIGS. 1 and 2) illustrated in FIGS. 5 and 6 and an optical simulation result of the organic light emitting device according to the second embodiment of the present invention, it can be seen that a luminance of blue light, in which emission efficiency is low, is enhanced in similar color coordinates. Also, it can be seen that a luminance of green light is enhanced.

Analogizing actual luminance on the basis of an optical simulation result, the blue pixel Bp of the organic light emitting device of the comparative example obtains an emission efficiency of 3.5 [Cd/A]. The blue pixel Bp of the organic light emitting device according to the second embodiment of the present invention obtains an emission efficiency of 4.8 [Cd/A]. That is, an emission efficiency of the blue pixel Bp is enhanced by 37% or more.

Moreover, the green pixel Gp of the organic light emitting device of the comparative example obtains an emission efficiency of 705 [Cd/A]. The green pixel Gp of the organic light emitting device according to the second embodiment of the present invention obtains an emission efficiency of 71.7 [Cd/A]. That is, an emission efficiency of the green pixel Gp is enhanced by about 2.42%.

Therefore, since the emission efficiency of the blue pixel Bp and the green pixel Gp is enhanced, an efficiency of white light is also enhanced from 26 [Cd/A] to 29.3 [Cd/A], and thus, in comparison with the comparative example, the efficiency of the white light is enhanced by about 12.7%.

Third Embodiment of the Present Invention

Figure 9:
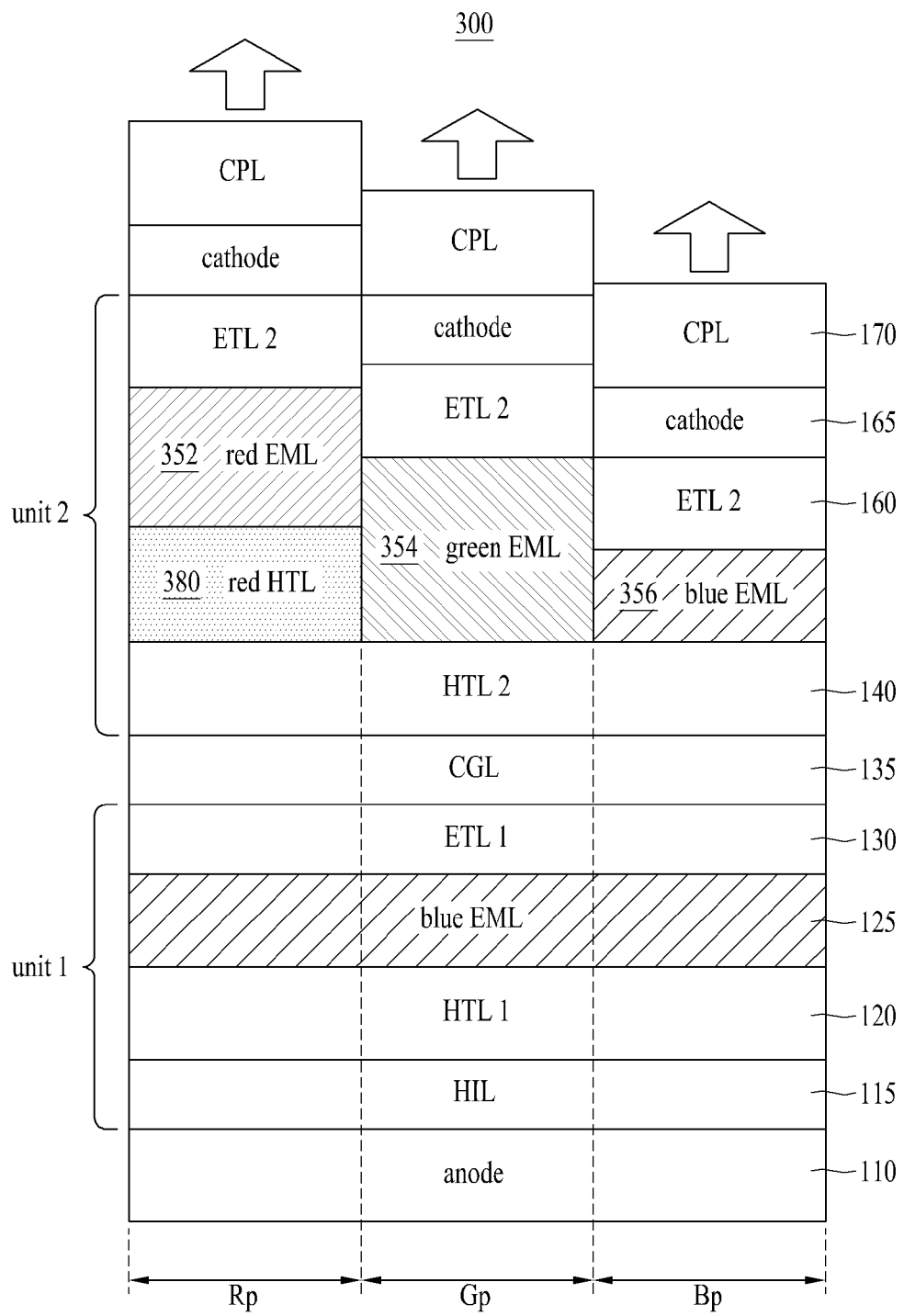
FIG. 9 is a diagram illustrating red, green, and blue pixel structures of an organic light emitting device according to a third embodiment of the present invention.

FIG. 9 is a diagram illustrating red, green, and blue pixel structures of an organic light emitting device 300 according to a third embodiment of the present invention. FIG. 9 illustrates a pixel structure having a top emission type to which a micro cavity structure is applied.

In describing a pixel structure of the organic light emitting device according to the third embodiment of the present invention, detailed descriptions on the same elements as those of the first and second embodiments of the present invention may not be provided.

Referring to FIG. 9, the organic light emitting device 300 according to the third embodiment of the present invention includes a first electrode (an anode electrode) 110, a second electrode (a cathode electrode) 165, and an organic emission layer. The organic light emitting device has a structure in which the organic emission layer is formed between the first electrode (the anode electrode) 110 injecting a positive hole and the second electrode (the cathode electrode) 165 injecting an electron. A capping layer (CPL) 170 is formed on the second electrode (the cathode electrode) 165.

The organic emission layer of the organic light emitting device 300 according to the third embodiment of the present invention is formed in a structure of two emission units (2unit). A first emission unit (unit1) of the organic emission layer has a structure that emits blue light. A second emission unit (unit2) of the organic emission layer has a structure that emits red light, green light, and blue light.

The first electrode (the anode electrode) 110 is formed as a reflective electrode, and the second electrode (the cathode electrode) 165 is formed as a semi-transmissive electrode, thereby forming a micro cavity.

The organic emission layer of the organic light emitting device 300 according to the third embodiment of the present invention include an HIL 115, a first HTL (HTL1) 120, a common blue EML 125, a first ETL (ETL1) 130, a charge generation layer (CGL) 135, a second HTL (HTL2) 140, a red EML 352, a green EML 354, a blue EML 356, and a second ETL (ETL2) 160. Also, the organic emission layer of the organic light emitting device 300 according to the third embodiment of the present invention may further include a red HTL 380 of a red pixel Rp.

The HIL 115 is formed on the first electrode (the anode electrode) 110, and the first HTL (HTL1) 120 is formed on the HIL 115. The common blue EML 125 is formed on the first HTL (HTL1) 120. The first ETL (ETL1) 130 is formed on the common blue EML 125.

The charge generation layer (CGL) 135 is formed as an optical compensation layer on the first ETL (ETL1) 130. The second HTL (HTL2) 140 is formed on the CGL 135.

The red HTL 380 is formed on the second HTL (HTL2) 140 in a red pixel area Rp. The red EML 352 is formed on the red HTL 380. The green EML 354 is formed on the second HTL (HTL2) 140 in a green pixel area Gp. The blue EML 356 is formed on the second HTL (HTL2) 140 in a blue pixel area Bp.

The second ETL (ETL2) 160 is formed on the red EML 352, the green EML 354, and the blue EML 356. The second electrode (the cathode electrode) 165 is formed on the second ETL (ETL2) 160.

Here, a first emission unit (unit1) of the organic emission layer includes the HIL 115, the first HTL (HTL1) 120, the common blue EML 125, and the first ETL (ETL1) 130.

A second emission unit (unit2) of the organic emission layer includes the second HTL (HTL2) 140, the red EML 352, the green EML 354, the blue EML 356, the red HTL 380, and the second ETL (ETL2) 160.

In the first emission unit (unit1), the common blue EML 125 is formed in the red pixel Rp, the green pixel Gp, and the blue pixel Bp in common Furthermore, the red EML 352, the green EML 354, and the blue EML 356 are formed in the second emission unit (unit2).

Each of the red pixel Rp, the green pixel Gp, and the blue pixel Bp has a micro cavity structure, and a thickness of an optical distance may be set by an EML.

An optical distance of a cavity structure is adjusted by using the elements of the second unit. Red light, green light, and blue light are emitted by adjusting a charge balance of a positive hole and an electron and an exciton generation area in which light is emitted in the EML.

In comparison with the first embodiment of the present invention, according to the third embodiment of the present invention, the red HTL 380 is further formed in the red pixel Rp, and thus, a thickness of the red EML 352 of the red pixel Rp is changed.

FIG. 10 is a diagram illustrating a thickness of an organic emission layer formed in each of red, green, and blue pixels of an organic light emitting device according to a third embodiment of the present invention.

A thickness of the blue pixel Bp for amplifying a cavity of each emission wavelength area may be 1,500 Å to 2,000 Å. A thickness of the green pixel Gp may be 2,000 Å to 2,700 Å. A thickness of the red pixel Rp may be 2,500 Å to 3,100 Å.

Referring to FIG. 10, the HIL 115 is formed to the same thickness in the red pixel Rp, the green pixel Gp, and the blue pixel Bp. For example, the HIL 115 may be formed to a thickness of 10 nm.

The first HTL (HTL1) 120 is formed to the same thickness in the red pixel Rp, the green pixel Gp, and the blue pixel Bp. For example, the first HTL (HTL1) 120 may be formed to a thickness of 30 nm.

The first ETL (ETL1) 130 is formed to the same thickness in the red pixel Rp, the green pixel Gp, and the blue pixel Bp. For example, the first ETL (ETL1) 130 may be formed to a thickness of 35 nm.

The CGL 135 is formed to the same thickness in the red pixel Rp, the green pixel Gp, and the blue pixel Bp. For example, the CGL 135 may be formed to a thickness of 10 nm.

The second HTL (HTL2) 140 is formed to the same thickness in the red pixel Rp, the green pixel Gp, and the blue pixel Bp. For example, the second HTL (HTL2) 140 may be formed to a thickness of 42 nm.

The second ETL (ETL2) 160 is formed to the same thickness in the red pixel Rp, the green pixel Gp, and the blue pixel Bp. For example, the second ETL (ETL2) 160 may be formed to a thickness of 35 nm.

Moreover, the first electrode (the anode electrode) 110 is the reflective electrode, and is formed in a structure where an ITO layer (a thickness: 70 Å), a reflective layer (APC, a thickness: 100 Å), and an ITO layer (a thickness: 70 Å) are stacked. In this case, APC is formed of an alloy which contains silver (Ag) by 90% or more.

The second electrode (the cathode electrode) 165 which is the semi-transmissive electrode is formed to the same thickness in the red pixel Rp, the green pixel Gp, and the blue pixel Bp. For example, the second electrode (the cathode electrode) 165 is formed as the semi-transmissive electrode by forming a LiF layer on a second ETL (ETL2) 160 to a thickness of 15 Å and forming a Ag:Mg layer at a ratio of 1:1 to a thickness of 160 Å.

The common blue EML (EML1) 125 of the first emission unit (unit1) is formed to the same thickness in the red pixel Rp, the green pixel Gp, and the blue pixel Bp. For example, the common blue EML (EML1) 125 may be formed to a thickness of 19 nm to 31 nm.

The red HTL 380 of the red pixel Rp is formed to a thickness of 10 nm.

In order to form an optical distance suitable for an emission wavelength of the red pixel Rp, the green pixel Gp, and the blue pixel Bp, a thickness of the EML (EML1) of the first emission unit (unit1) may differ from that of the EML (EML2) of the second emission unit (unit2). In this case, the EML (EML1) of the first emission unit (unit1) is formed to the same thickness in the red pixel Rp, the green pixel Gp, and the blue pixel Bp, and the thickness of the EML (EML2) of the second emission unit (unit2) may be adjusted.

Optical distances of micro cavities of the red pixel Rp, the green pixel Gp, and the blue pixel Bp are satisfied by thicknesses of the red EML of the red pixel Rp, the green EML of the green pixel Gp, and the blue EML of the blue pixel Bp.

For example, the red EML 352 of the red pixel Rp may be formed to a thickness of 93.6 nm. The green EML 354 of the green pixel Gp may be formed to a thickness of 52 nm. The blue EML 356 of the blue pixel Bp may be formed to a thickness of 7 nm to 19 nm.

Here, a color cavity is controlled for adjusting a color sense of red, green, and blue.

For example, a color cavity of the blue pixel Bp may be controlled by a thickness of the first HTL (HTL1) 120 of the first emission unit (unit1). A color cavity of the red pixel Rp may be controlled by a thickness of the red EML 352 of the second emission unit (unit2). Also, a color cavity of the green pixel Gp may be controlled by a thickness of the green EML 354.

Here, in the red pixel Rp, the red HTL 380 is formed to a thickness of 10 nm, and a thickness of the red EML 352 is adjusted. A phosphor material forming the EML has a long service life, but is low in light efficiency. On the other hand, the phosphor material is high in light efficiency, but has a short service life.

In the organic light emitting device according to the third embodiment of the present invention, the first EML (EML1) and second EML (EML2) of the blue pixel Bp may be formed of different materials, for enhancing a light efficiency and a service life of the blue pixel Bp.

For example, the first EML (EML1) may be formed of a fluorescent material, and the second EML (EML2) may be formed of a phosphor material. As another example, the first EML (EML1) may be formed of a phosphor material, and the second EML (EML2) may be formed of a fluorescent material. That is, the common blue EML (EML1) 125 may be formed of a fluorescent material, and the blue EML 356 may be formed of a phosphor material. On the other hand, the common blue EML (EML1) 125 may be formed of a phosphor material, and the blue EML 356 may be formed of a fluorescent material.

Blue light is emitted from the common blue EML (EML1) 125 in the first unit. In this case, in the red pixel Rp and the green pixel Gp, the blue light is depleted by a control of a color cavity (an optical distance of a micro cavity and charge balance). However, in the blue pixel Bp, the blue light is not depleted but is amplified by the micro cavity.

In the second emission unit (unit2), red light is emitted from the red pixel Rp, green light is emitted from the green pixel Gp, and blue light is emitted from the blue pixel Bp. Also, the red light, the green light, and the blue light pass through the second electrode (the cathode electrode) 165, and are output to the outside. In this case, the blue light generated from the first emission unit (unit1) and the blue light generated from the second emission unit (unit2) are summated in the blue pixel Bp, and thus, an efficiency of the blue light is enhanced. Also, a service life of the blue pixel Bp increases.

Optical Simulation Result of Third Embodiment of the Present Invention

Referring again to FIGS. 5 and 6, the conditions of the pixel structures illustrated in FIGS. 9 and 10 are applied to optical simulation equipment (Setfos 3.3 of FLUXim Company), and an optical simulation of the organic light emitting device according to the third embodiment of the present invention has been performed. An organic emission layer is formed under the conditions of FIG. 10, and then, optical simulation results of the red pixel, the green pixel, and the blue pixel are listed in the following Table 5.

TABLE 5

|  |  | blue | green | red |
|---|---|---|---|---|
| Curr. Eff. [Cd/A] |  | 4.4301 | 32.9466 | 15.3219 |
| color | CIE_x | 0.1376 | 0.2142 | 0.6448 |
|  | CIE_y | 0.0499 | 0.6799 | 0.3262 |

Referring to Table 5, an optical simulation result in which blue light is emitted at a luminance of 4.4301 [Cd/A] is obtained in the blue pixel Bp. In this case, in color coordinates, CIE_x is 0.1376, and CIE_y is 0.0499.

An optical simulation result in which green light is emitted at a luminance of 32.9466 [Cd/A] is obtained in the green pixel Gp. In this case, in color coordinates, CIE_x is 0.2142, and CIE_y is 0.6799.

An optical simulation result in which red light is emitted at a luminance of 15.3219 [Cd/A] is obtained in the red pixel Rp. In this case, in color coordinates, CIE_x is 0.6448, and CIE_y is 0.3262.

Luminance characteristics of color lights, emitted from a red pixel, a green pixel, and a blue pixel of an organic light emitting device according to embodiments of the present invention, and a luminance characteristic of white light can be analogized by using an optical simulation result.

Comparing the comparative example (FIGS. 1 and 2) illustrated in FIG. 6 and an optical simulation result of the organic light emitting device according to the third embodiment of the present invention, it can be seen that a luminance of blue light, in which emission efficiency is low, is enhanced in similar color coordinates. Also, it can be seen that a luminance of red light is enhanced.

Analogizing actual luminance on the basis of an optical simulation result, the blue pixel Bp of the organic light emitting device of the comparative example obtains an emission efficiency of 3.5 [Cd/A]. The blue pixel Bp of the organic light emitting device according to the second embodiment of the present invention obtains an emission efficiency of 4.8 [Cd/A]. That is, an emission efficiency of the blue pixel Bp is enhanced by 37% or more.

Moreover, the red pixel Rp of the organic light emitting device of the comparative example obtains an emission efficiency of 33 [Cd/A]. The red pixel Rp of the organic light emitting device according to the third embodiment of the present invention obtains an emission efficiency of 37.13 [Cd/A]. That is, an emission efficiency of the red pixel Rp is enhanced by about 12.5%.

Therefore, since the emission efficiency of the blue pixel Bp and the green pixel Gp is enhanced, an efficiency of white light is also enhanced from 26 [Cd/A] to 31.6 [Cd/A], and thus, in comparison with the comparative example, the efficiency of the white light is enhanced by about 21.5%.

Fourth Embodiment of the Present Invention

FIG. 12 is a diagram illustrating a thickness of an organic emission layer formed in each of red, green, and blue pixels of an organic light emitting device 400 according to a fourth embodiment of the present invention. FIG. 12 illustrates a pixel structure having a top emission type to which a micro cavity structure is applied.

In describing a pixel structure of the organic light emitting device according to the fourth embodiment of the present invention, detailed descriptions on the same elements as those of the first to third embodiments of the present invention may not be provided.

Figure 11:
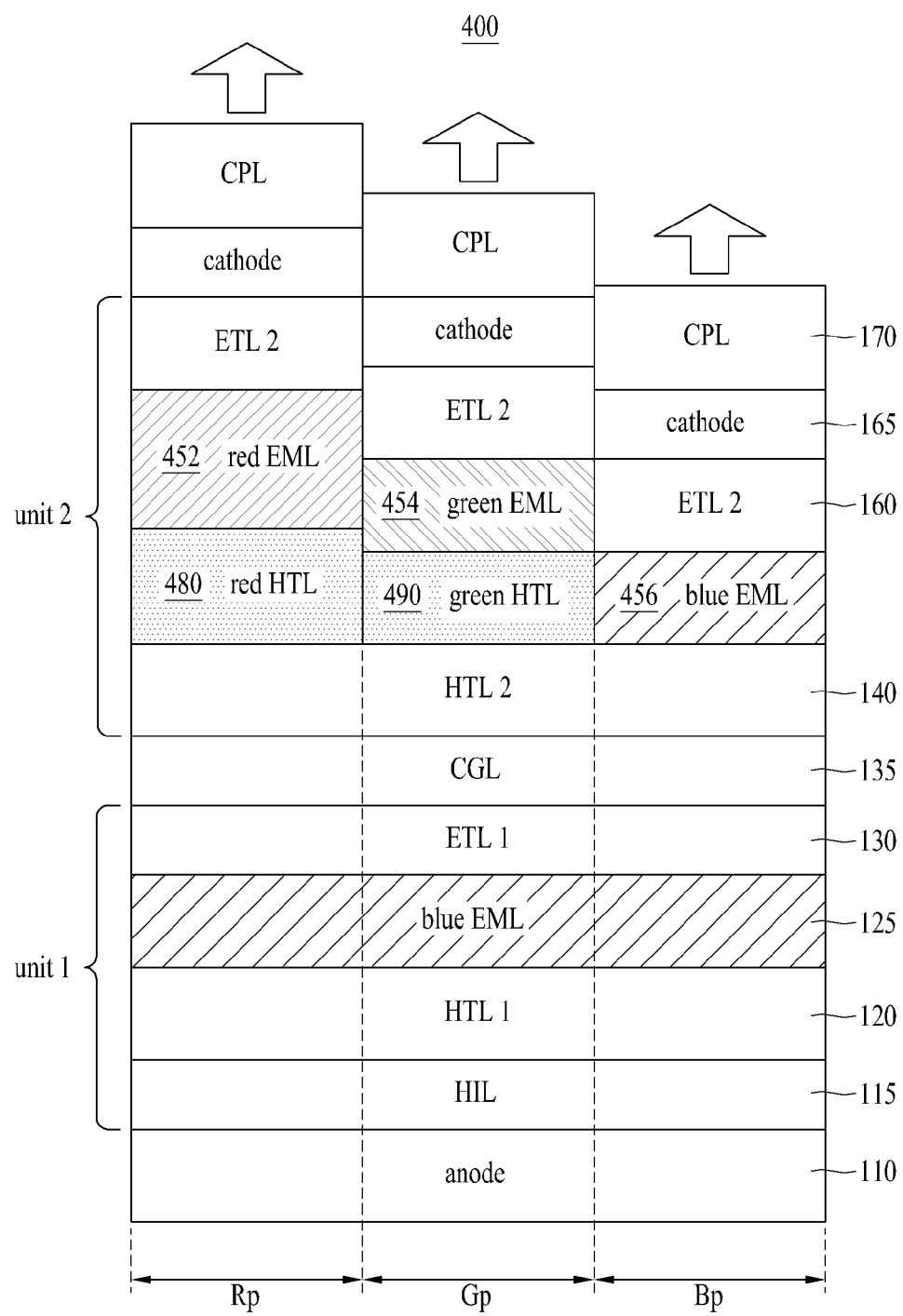
FIG. 11 is a diagram illustrating red, green, and blue pixel structures of an organic light emitting device according to a fourth embodiment of the present invention.

Referring to FIG. 11, the organic light emitting device 400 according to the fourth embodiment of the present invention includes a first electrode (an anode electrode) 110, a second electrode (a cathode electrode) 165, and an organic emission layer. The organic light emitting device has a structure in which the organic emission layer is formed between the first electrode (the anode electrode) 110 injecting a positive hole and the second electrode (the cathode electrode) 165 injecting an electron. A capping layer (CPL) 170 is formed on the second electrode (the cathode electrode) 165.

The organic emission layer of the organic light emitting device 400 according to the fourth embodiment of the present invention is formed in a structure of two emission units (2unit). A first emission unit (unit1) of the organic emission layer has a structure that emits blue light. A second emission unit (unit2) of the organic emission layer has a structure that emits red light, green light, and blue light.

The first electrode (the anode electrode) 110 is formed as a reflective electrode, and the second electrode (the cathode electrode) 165 is formed as a semi-transmissive electrode, thereby forming a micro cavity.

The organic emission layer of the organic light emitting device 400 according to the fourth embodiment of the present invention include an HIL 115, a first HTL (HTL1) 120, a common blue EML 125, a first ETL (ETL1) 130, a charge generation layer (CGL) 135, a second HTL (HTL2) 140, a red EML 452, a green EML 454, a blue EML 456, and a second ETL (ETL2) 160.

Moreover, the organic emission layer of the organic light emitting device 400 according to the fourth embodiment of the present invention may further include a red HTL 480 of a red pixel Rp and a green HTL 490 of a green pixel Gp. The HIL 115 is formed on the first electrode (the anode electrode) 110, and the first HTL (HTL1) 120 is formed on the HIL 115. The common blue EML 125 is formed on the first HTL (HTL1) 120. The first ETL (ETL1) 130 is formed on the common blue EML 125.

The charge generation layer (CGL) 135 is formed as an optical compensation layer on the first ETL (ETL1) 130. The second HTL (HTL2) 140 is formed on the CGL 135.

The red HTL 480 is formed on the second HTL (HTL2) 140 in a red pixel area Rp. The red EML 452 is formed on the red HTL 480.

The green HTL 490 is formed on the second HTL (HTL2) 140 in a green pixel area Gp. The green EML 454 is formed on the green HTL 490.

The blue EML 456 is formed on the second HTL (HTL2) 140 in a blue pixel area Bp.

The second ETL (ETL2) 160 is formed on the red EML 452, the green EML 454, and the blue EML 456. The second electrode (the cathode electrode) 165 is formed on the second ETL (ETL2) 160.

Here, a first emission unit (unit1) of the organic emission layer includes the HIL 115, the first HTL (HTL1) 120, the common blue EML 125, and the first ETL (ETL1) 130.

A second emission unit (unit2) of the organic emission layer includes the second HTL (HTL2) 140, the red EML 452, the green EML 454, the blue EML 456, the red HTL 480, the green HTL 490, and the second ETL (ETL2) 160.

In the first emission unit (unit1), the common blue EML 125 is formed in the red pixel Rp, the green pixel Gp, and the blue pixel Bp in common Furthermore, the red EML 452, the green EML 454, and the blue EML 456 are formed in the second emission unit (unit2). Each of the red pixel Rp, the green pixel Gp, and the blue pixel Bp has a micro cavity structure, and a thickness of an optical distance may be set by an EML.

Optical distances of micro cavities of the red pixel Rp, the green pixel Gp, and the blue pixel Bp are satisfied by thicknesses of the red EML of the red pixel Rp, the green EML of the green pixel Gp, and the blue EML of the blue pixel Bp.

An optical distance of a cavity structure is adjusted by using the elements of the second unit. Red light, green light, and blue light are emitted by adjusting a charge balance of a positive hole and an electron and an exciton generation area in which light is emitted in the EML. In comparison with the first embodiment of the present invention, according to the third embodiment of the present invention, the red HTL 480 is further formed in the red pixel Rp, and thus, a thickness of the red EML 452 of the red pixel Rp is changed.

Moreover, the green HTL 490 is further formed in the green pixel Gp, and thus, a thickness of the green EML 454 of the green pixel Gp is changed.

FIG. 12 is a diagram illustrating a thickness of an organic emission layer formed in each of red, green, and blue pixels of the organic light emitting device 400 according to the fourth embodiment of the present invention.

A thickness of the blue pixel Bp for amplifying a cavity of each emission wavelength area may be 1,500 Å to 2,000 Å. A thickness of the green pixel Gp may be 2,000 Å to 2,700 Å. A thickness of the red pixel Rp may be 2,500 Å to 3,100 Å.

Referring to FIG. 12, the HIL 115 is formed to the same thickness in the red pixel Rp, the green pixel Gp, and the blue pixel Bp. For example, the HIL 115 may be formed to a thickness of 10 nm.

The first HTL (HTL1) 120 is formed to the same thickness in the red pixel Rp, the green pixel Gp, and the blue pixel Bp. For example, the first HTL (HTL1) 120 may be formed to a thickness of 30 nm.

The first ETL (ETL1) 130 is formed to the same thickness in the red pixel Rp, the green pixel Gp, and the blue pixel Bp. For example, the first ETL (ETL1) 130 may be formed to a thickness of 35 nm.

The CGL 135 is formed to the same thickness in the red pixel Rp, the green pixel Gp, and the blue pixel Bp. For example, the CGL 135 may be formed to a thickness of 10 nm.

The second HTL (HTL2) 140 is formed to the same thickness in the red pixel Rp, the green pixel Gp, and the blue pixel Bp. For example, the second HTL (HTL2) 140 may be formed to a thickness of 42 nm.

The second ETL (ETL2) 160 is formed to the same thickness in the red pixel Rp, the green pixel Gp, and the blue pixel Bp. For example, the second ETL (ETL2) 160 may be formed to a thickness of 35 nm.

Moreover, the first electrode (the anode electrode) 110 is the reflective electrode, and is formed in a structure where an ITO layer (a thickness: 70 Å), a reflective layer (APC, a thickness: 100 Å), and an ITO layer (a thickness: 70 Å) are stacked. In this case, APC is formed of an alloy which contains silver (Ag) by 90% or more.

The second electrode (the cathode electrode) 165 which is the semi-transmissive electrode is formed to the same thickness in the red pixel Rp, the green pixel Gp, and the blue pixel Bp. For example, the second electrode (the cathode electrode) 165 is formed as the semi-transmissive electrode by forming a LiF layer on a second ETL (ETL2) 160 to a thickness of 15 Å and forming a Ag:Mg layer at a ratio of 1:1 to a thickness of 160 Å.

The common blue EML (EML1) 125 of the first emission unit (unit1) is formed to the same thickness in the red pixel Rp, the green pixel Gp, and the blue pixel Bp. For example, the common blue EML (EML1) 125 may be formed to a thickness of 19 nm to 31 nm.

The red HTL 480 of the red pixel Rp is formed to a thickness of 10 nm.

The green HTL 490 of the green pixel Gp is formed to a thickness of 12 nm.

In order to form an optical distance suitable for an emission wavelength of the red pixel Rp, the green pixel Gp, and the blue pixel Bp, a thickness of the EML (EML1) of the first emission unit (unit1) may differ from that of the EML (EML2) of the second emission unit (unit2). In this case, the EML (EML1) of the first emission unit (unit1) is formed to the same thickness in the red pixel Rp, the green pixel Gp, and the blue pixel Bp, and the thickness of the EML (EML2) of the second emission unit (unit2) may be adjusted.

For example, the red EML 452 of the red pixel Rp may be formed to a thickness of 93.6 nm. The green EML 454 of the green pixel Gp may be formed to a thickness of 41 nm. The blue EML 456 of the blue pixel Bp may be formed to a thickness of 7 nm to 19 nm.

Here, a color cavity is controlled for adjusting a color sense of red, green, and blue.

For example, a color cavity of the blue pixel Bp may be controlled by a thickness of the first HTL (HTL1) 120 of the first emission unit (unit1). A color cavity of the red pixel Rp may be controlled by a thickness of the red EML 352 of the second emission unit (unit2). Also, a color cavity of the green pixel Gp may be controlled by a thickness of the green EML 354.

Here, in the red pixel Rp, the red HTL 480 is formed to a thickness of 10 nm, and a thickness of the red EML 452 is adjusted.

Moreover, in the green pixel Gp, the green HTL 490 is formed to a thickness of 12 nm, and a thickness of the green EML 454 is adjusted. A phosphor material forming the EML has a long service life, but is low in light efficiency. On the other hand, the phosphor material is high in light efficiency, but has a short service life.

In the organic light emitting device according to the fourth embodiment of the present invention, the first EML (EML1) and second EML (EML2) of the blue pixel Bp may be formed of different materials, for enhancing a light efficiency and a service life of the blue pixel Bp.

For example, the first EML (EML1) may be formed of a fluorescent material, and the second EML (EML2) may be formed of a phosphor material. As another example, the first EML (EML1) may be formed of a phosphor material, and the second EML (EML2) may be formed of a fluorescent material. That is, the common blue EML (EML1) 125 may be formed of a fluorescent material, and the blue EML 456 may be formed of a phosphor material. On the other hand, the common blue EML (EML1) 125 may be formed of a phosphor material, and the blue EML 456 may be formed of a fluorescent material.

Blue light is emitted from the common blue EML (EML1) 125 in the first unit. In this case, in the red pixel Rp and the green pixel Gp, the blue light is depleted by a control of a color cavity (an optical distance of a micro cavity and charge balance). However, in the blue pixel Bp, the blue light is not depleted but is amplified by the micro cavity.

In the second emission unit (unit2), red light is emitted from the red pixel Rp, green light is emitted from the green pixel Gp, and blue light is emitted from the blue pixel Bp. Also, the red light, the green light, and the blue light pass through the second electrode (the cathode electrode) 165, and are output to the outside. In this case, the blue light generated from the first emission unit (unit1) and the blue light generated from the second emission unit (unit2) are summated in the blue pixel Bp, and thus, an efficiency of the blue light is enhanced. Also, a service life of the blue pixel Bp increases.

Optical Simulation Result of Fourth Embodiment of the Present Invention

The conditions of the pixel structures illustrated in FIGS. 11 and 12 are applied to optical simulation equipment (Setfos 3.3 of FLUXim Company), and an optical simulation of the organic light emitting device according to the fourth embodiment of the present invention has been performed. An organic emission layer is formed under the conditions of FIG. 12, and then, optical simulation results of the red pixel, the green pixel, and the blue pixel are listed in the following Table 5.

TABLE 6

|  |  | blue | green | red |
|---|---|---|---|---|
| Curr. Eff. [Cd/A] |  | 4.4301 | 33.8095 | 15.3219 |
| color | CIE_x | 0.1376 | 0.2151 | 0.6448 |
|  | CIE_y | 0.0499 | 0.6779 | 0.3262 |

Referring to Table 6, an optical simulation result in which blue light is emitted at a luminance of 4.4301 [Cd/A] is obtained in the blue pixel Bp. In this case, in color coordinates, CIE_x is 0.1376, and CIE_y is 0.0499.

An optical simulation result in which green light is emitted at a luminance of 33.8095 [Cd/A] is obtained in the green pixel Gp. In this case, in color coordinates, CIE_x is 0.2151, and CIE_y is 0.6799.

An optical simulation result in which red light is emitted at a luminance of 15.3219 [Cd/A] is obtained in the red pixel Rp. In this case, in color coordinates, CIE_x is 0.6448, and CIE_y is 0.3262.

Luminance characteristics of color lights, emitted from a red pixel, a green pixel, and a blue pixel of an organic light emitting device according to embodiments of the present invention, and a luminance characteristic of white light can be analogized by using an optical simulation result.

Comparing the comparative example (FIGS. 1 and 2) illustrated in FIGS. 5 and 6 and an optical simulation result of the organic light emitting device according to the fourth embodiment of the present invention, it can be seen that a luminance of blue light, in which emission efficiency is low, is enhanced in similar color coordinates. Also, it can be seen that a luminance of red light is enhanced.

Analogizing actual luminance on the basis of an optical simulation result, the blue pixel Bp of the organic light emitting device of the comparative example obtains an emission efficiency of 3.5 [Cd/A]. The blue pixel Bp of the organic light emitting device according to the second embodiment of the present invention obtains an emission efficiency of 4.8 [Cd/A]. That is, an emission efficiency of the blue pixel Bp is enhanced by 37% or more.

Moreover, the green pixel Gp of the organic light emitting device of the comparative example obtains an emission efficiency of 70 [Cd/A]. The green pixel Gp of the organic light emitting device according to the fourth embodiment of the present invention obtains an emission efficiency of 71.7 [Cd/A]. That is, an emission efficiency of the green pixel Gp is enhanced by about 2.5%.

Moreover, the red pixel Rp of the organic light emitting device of the comparative example obtains an emission efficiency of 33 [Cd/A]. The red pixel Rp of the organic light emitting device according to the fourth embodiment of the present invention obtains an emission efficiency of 37.13 [Cd/A]. That is, an emission efficiency of the red pixel Rp is enhanced by about 12.5%.

Therefore, since the emission efficiency of the blue pixel Bp and the green pixel Gp is enhanced, an efficiency of white light is also enhanced from 26 [Cd/A] to 31.9 [Cd/A], and thus, in comparison with the comparative example, the efficiency of the white light is enhanced by about 22.7%.

Considering an emission efficiency of the organic light emitting device according to the first to fourth embodiments of the present invention, the optical simulation result of the comparative example, and luminance prediction data based on the optical simulation result, it can be seen that the organic light emitting device according to the first to fourth embodiments of the present invention has light efficiency that is more enhanced than the organic light emitting device according to the comparative example.

In the organic light emitting device according to the embodiments of the present invention, a light efficiency of at least one selected from a red pixel, a green pixel, and a blue pixel is enhanced, and thus, a service life of a light emitting element and a service life of a display panel including the light emitting element are enhanced.

In the organic light emitting device according to the embodiments of the present invention, an organic emission layer is formed in an emission structure including two emission units, thereby enhancing an emission efficiency of red light, green light, and blue light.

In the organic light emitting device according to the embodiments of the present invention, an organic emission layer is formed in an emission structure including two emission units, thereby enhancing a service life of an organic light emitting element and a service life of a display panel including the organic light emitting element.

In the organic light emitting device according to the embodiments of the present invention, an organic emission layer is formed in an emission structure including two emission units, thereby increasing a luminance of white light as well as a luminance of each of red light, green light, and blue light.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device including red, green, and blue pixels, the organic light emitting device comprising:
   a first emission unit configured to include a first hole transport layer, a first electron transport layer on the first hole transport layer, and a common blue emission layer disposed between the first hole transport layer and the first electron transport layer, the common blue emission layer disposed in a plane common to the red, green and blue pixels;
   a second emission unit configured to include a red emission material layer in the red pixel, a green emission material layer in the green pixel, and a blue emission material layer in the blue pixel, each of the red, green, and blue emission material layers being respectively configured to emit light having a different wavelength range;
   a charge generation layer disposed between the first emission unit and the second emission unit;
   a common first electrode including a reflective material disposed in another plane such that the common first electrode is common to the red, green and blue pixels, the common first electrode being configured to supply electric charges having a first polarity to the first emission unit and the second emission unit; and
   a plurality of second electrodes each including a semi-transmissive electrode and respectively disposed in the red, green and blue pixels, the second electrodes configured to supply electric charges having a second polarity to the first emission unit and the second emission unit,
   wherein respective micro cavities are defined in each of the red, green and blue pixels between the common first electrode and the respective second electrodes,
   wherein the second emission unit further comprises a second hole transport layer and at least one of a red hole transport layer directly on the second hole transport layer in the red pixel and a green hole transport layer directly on the second hole transport layer in the green pixel, and
   wherein the red hole transport layer is separate from the a green hole transport layer.

2. The organic light emitting device of claim 1, wherein the first emission unit further comprises a hole injection layer disposed on the common first electrode, wherein the first hole transport layer is disposed on the hole injection layer.

3. The organic light emitting device of claim 1, wherein an optical distance of a micro cavity is satisfied by using a thickness of the first hole transport layer.

4. The organic light emitting device of claim 1, wherein the second emission unit comprises:
   a second electron transport layer disposed on the red emission material layer, the green emission material layer, and the blue emission material layer.

5. The organic light emitting device of claim 4, wherein an optical distance of each micro cavity includes a thickness of a respective one of the red emission material layer, the green emission material layer, and the blue emission material layer.

6. The organic light emitting device of claim 5, wherein the red emission material layer, the green emission material layer, and the blue emission material layer are disposed between the second hole transport layer and the second electron transport layer.

7. The organic light emitting device of claim 1, wherein the charge generation layer is included in the red pixel, the green pixel, and the blue pixel in common.

8. The organic light emitting device of claim 1, wherein the common blue emission layer is included in the red pixel, the green pixel, and the blue pixel in common.

9. The organic light emitting device of claim 1, wherein:
a thickness of the blue pixel is 1,500 Å to 2,000 Å,
a thickness of the green pixel is 2,000 Å to 2,700 Å, and
a thickness of the red pixel is 2,500 Å to 3,100 Å.

10. The organic light emitting device of claim 1, wherein,
the common blue emission layer and the red emission material layer have different thicknesses, and
the green emission material layer and the blue emission material layer have different thicknesses.

11. The organic light emitting device of claim 10, wherein the common blue emission layer has a thickness of 19 nm to 31 nm.

12. The organic light emitting device of claim 11, wherein the red emission material layer has a thickness of 93.6 nm to 115.6 nm.

13. The organic light emitting device of claim 12, further comprising a red hole transport layer disposed under the red emission material layer.

14. The organic light emitting device of claim 12, wherein the green emission material layer has a thickness of 41 nm to 53 nm.

15. The organic light emitting device of claim 14, further comprising a green hole transport layer disposed under the green emission material layer.

16. The organic light emitting device of claim 14, wherein the blue emission material layer has a thickness of 7 nm to 19 nm.

17. The organic light emitting device of claim 1, wherein the common blue emission layer includes one of a fluorescent material and a phosphor material, and wherein the red emission material layer, the green emission material layer, and the blue emission material layer each include materials of the other one of the fluorescent material and the phosphor material.

18. An organic light emitting device including red, green, and blue pixels each of which defines a respective micro cavity, the organic light emitting device comprising:
a first emission unit including a common blue emission layer which is disposed in common to the red, green and blue pixels;
a second emission unit including a red emission material layer in the red pixel, a green emission material layer in the green pixel, and a blue emission material layer in the blue pixel, each of the red, green, and blue emission material layers being respectively configured to emit light having a different wavelength range;
a charge generation layer disposed between the first emission unit and the second emission unit;
a first electrode including a reflective material and configured to supply electric charges having a first polarity to the first emission unit and the second emission unit; and
a plurality of second electrodes each including a semi-transmissive electrode and respectively disposed in the red, green and blue pixels, the second electrodes configured to supply electric charges having a second polarity to the first emission unit and the second emission unit,
wherein the first emission unit comprises:
a hole injection layer disposed on the first electrode;
a first hole transport layer disposed on the hole injection layer;
a first electron transport layer disposed on the common blue emission layer; and
the common blue emission layer disposed between the first hole transport layer
and the first electron transport layer;
wherein the second emission unit comprises:
a second hole transport layer on the charge generation layer;
the red emission material layer, the green emission material layer, and the blue emission material layer on the second hole transport layer; and
a second electron transport layer on the red emission material layer, the green emission material layer, and the blue emission material layer,
wherein the second emission unit further comprises at least one of a red hole transport layer directly on the second hole transport layer in the red pixel and a green hole transport layer directly on the second hole transport layer in the green pixel, and
wherein the red hole transport layer is separate from the a green hole transport layer.

19. The organic light emitting device of claim 18, wherein the common blue emission layer has a thickness of 19 nm to 31 nm, the red emission material layer has a thickness of 93.6 nm to 115.6 nm, the green emission material layer has a thickness of 41 nm to 53 nm, and the blue emission material layer has a thickness of 7 nm to 19 nm.

* * * * *